US012796437B2

(12) United States Patent
Kang et al.

(10) Patent No.: US 12,796,437 B2
(45) Date of Patent: Nov. 10, 2026

(54) STRUCTURE INCLUDING RC-BASED POWER RAIL ESD CLAMPING CIRCUIT

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 18/128,020

(22) Filed: Mar. 29, 2023

(65) Prior Publication Data

US 2024/0332181 A1 Oct. 3, 2024

(51) Int. Cl.

| | |
|---|---|
| ***H10W 20/41*** | (2026.01) |
| ***H10D 89/60*** | (2025.01) |
| ***H10W 20/40*** | (2026.01) |

(52) U.S. Cl.

CPC ........ *H10W 20/427* (2026.01); *H10D 89/811* (2025.01); *H10D 89/921* (2025.01); *H10W 20/496* (2026.01); *H10W 20/498* (2026.01)

(58) Field of Classification Search

CPC .... H02H 9/046; H10D 89/819; H10D 89/911; H10D 89/921; H10D 84/038; H10D 89/811; H10D 89/931; H10W 20/481; H10W 20/496; H10W 20/497; H10W 20/498; H10W 20/20

See application file for complete search history.

(56) References Cited

U.S. PATENT DOCUMENTS

| | | | |
|---|---|---|---|
| 9,245,852 B2 | 1/2016 | Chen et al. | |
| 9,548,738 B2 | 1/2017 | Karp | |
| 10,819,110 B2 | 10/2020 | Kumar et al. | |
| 11,114,429 B2 | 9/2021 | Karp | |
| 11,398,469 B1 | 7/2022 | Karp | |
| 2022/0285338 A1 | 9/2022 | Yeh | |
| 2022/0320075 A1 | 10/2022 | Yeh et al. | |
| 2023/0008614 A1* | 1/2023 | Chiu | H10D 30/014 |
| 2024/0105605 A1* | 3/2024 | Xie | H10D 30/0198 |
| 2024/0363621 A1* | 10/2024 | Yeh | H10D 89/819 |

FOREIGN PATENT DOCUMENTS

| | | |
|---|---|---|
| DE | 112015006942 T5 | 6/2018 |

* cited by examiner

*Primary Examiner* — Edward Chin

(74) *Attorney, Agent, or Firm* — Scully, Scott, Murphy & Presser, P.C.; Kimberly Zillig

(57) ABSTRACT

A semiconductor structure is provided that includes an inverter including a p-type field transistor and an n-type field effect transistor) having a shared gate structure and located on a frontside of the structure. The semiconductor structure further includes a passive device located on a backside of the structure and electrically connected to the shared gate structure of the inverter by a backside extension contact structure, and a backside power distribution network electrically connected to the passive device.

20 Claims, 31 Drawing Sheets

STRUCTURE INCLUDING RC-BASED POWER RAIL ESD CLAMPING CIRCUIT

BACKGROUND

The present application relates to semiconductor technology, and more particularly to a semiconductor structure including a RC-based power rail electrostatic discharge (ESD) clamping circuit.

ESD is one of the major reliability issues in advanced complementary metal oxide semiconductor (CMOS) technologies. Using only I/O based ESD protection circuits is inadequate in providing the necessary ESD protection in advanced CMOS technologies. It has become increasingly important to implement an ESD power supply clamp across the power rails so that the ESD event will be discharged through the clamp, and thus protection of the circuit core can be achieved.

SUMMARY

A semiconductor structure including a RC-based power rail ESD clamp circuit is provided. The RC-based power rail ESD clamping circuit includes a backside extension contact structure to provide contact between a shared gate structure of an inverter and backside power rails. The use of through-silicon vias to provide such backside contact has been eliminated. Unlike through-silicon vias, the backside extension contact structure provides space saving and can be easily implemented during backside processing.

In one aspect of the present application, a semiconductor structure is provided. In one embodiment of the present application, the semiconductor structure includes an inverter located on a frontside of a wafer and including a p-type field transistor (pFET) and an n-type field effect transistor (nFET) having a shared gate structure. The semiconductor structure further includes a passive device located on a backside of the wafer and electrically connected to the shared gate structure of the inverter by a backside extension contact structure, and a backside power distribution network (BSPDN) electrically connected to the passive device.

In some embodiments of the present application, the passive device includes a capacitor and a resistor.

In some embodiments of the present application, the resistor is composed of a metal, metal nitride, metal oxide or polySi.

In some embodiments of the present application, the capacitor is a metal-insulator-metal (MIM) capacitor including a capacitor dielectric layer sandwiched between a first metal plate and a second metal plate.

In some embodiments of the present application, the first metal plate of the MIM capacitor contacts a first surface of the resistor, and the second metal plate of the MIM capacitor contacts a third backside metal level Vss power rail.

In some embodiments of the present application, the third backside metal level Vss power rail contacts the BSPDN.

In some embodiments of the present application, a second surface of the resistor contacts a third backside metal level Vdd power rail, and the third backside metal level Vdd power rail contacts the BSPDN.

In some embodiments of the present application, the backside extension contact structure has a first surface contacting a via extension portion of the shared gate structure and a second surface opposite the first surface that contacts the first metal plate of the MIM capacitor.

In some embodiments of the present application, the via extension portion of the shared gate structure is laterally surrounded by a shallow trench isolation structure.

In some embodiments of the present application, the pFET has a first source/drain region electrically connected to a first backside metal level Vdd power rail by a first backside source/contact structure, and the nFET has a first source/drain region electrically connected to a first backside metal level Vss power rail by a second backside source/drain contact structure.

In some embodiments of the present application, the pFET has a second source/drain region and the nFET has a second source/drain region, wherein the second source/drain region of the pFET and the second source/drain region of the nFET are electrically connected by a frontside contact structure.

In some embodiments of the present application, the frontside contact structure contacts a frontside back-of-the-line (BEOL) structure.

In some embodiments of the present application, the structure further includes a carrier wafer contacting the BEOL structure.

In some embodiments of the present application, the structure further includes a power rail clamping field effect transistor (FET) located adjacent to the inverter and having a larger gate length than the pFET and nFET of the inverter, and wherein a gate electrode of the power rail clamping FET is electrically connected to the BEOL structure by a frontside gate contact structure. This FET is a high-current capacity FET that enables, through Extreme Ultraviolet patterning technology, the use of the ESD power clamp for better discharge capability under an ESD stress condition.

In some embodiments of the present application, the power rail clamping FET has a first source/drain region electrically connected to a first backside metal level Vdd power rail by a first backside source/drain contact structure and a second source/drain region electrically connected to a first backside metal level Vss power rail by a second backside source/drain contact structure.

In some embodiments of the present application, the power rail clamping FET is connected in parallel between the first backside metal level Vdd power rail and the first backside metal level Vss power rail, and configured to provide a current path during an electrostatic discharge event.

In some embodiments of the present application, the power rail clamping FET, the pFET and the nFET are all nanosheet containing FETs.

In some embodiments of the present application, the structure further includes a bottom dielectric isolation layer located beneath each of the nanosheet containing FETs.

In some embodiments of the present application, the passive device is embedded in backside interlayer dielectric layers.

In some embodiments of the present application, the backside extension contact structure is configured to send excess current to ground during an electrostatic discharge event.

DETAILED DESCRIPTION

Figure 1A:
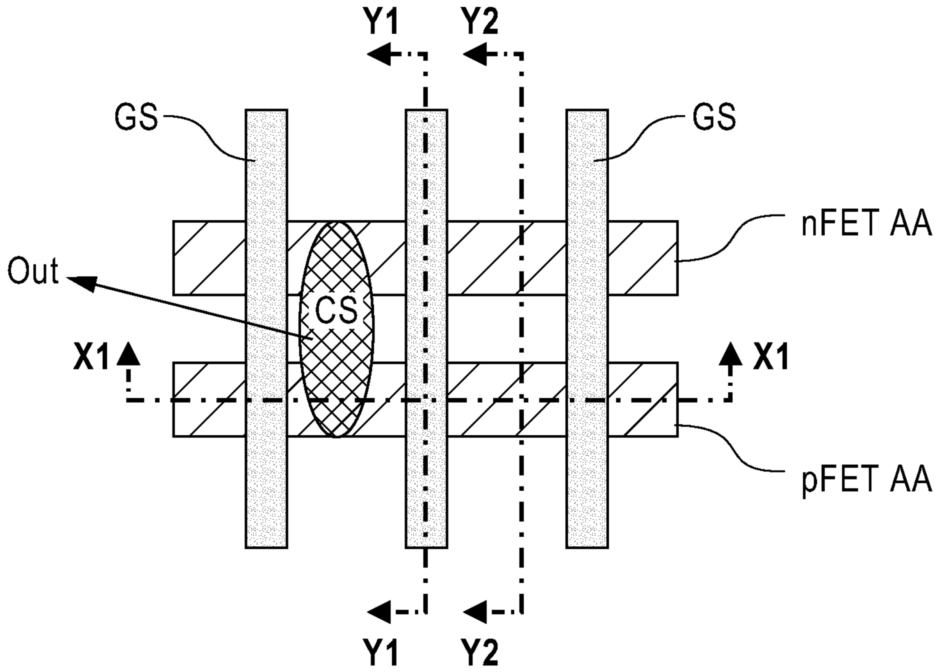
FIG. 1A is a top down view illustrating a device layout for a first region of a semiconductor structure in accordance with the present application and including cuts X1-X1, Y1-Y1, and Y2-Y2.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As mentioned above, ESD is one of the major reliability issues in advanced CMOS technologies. This has led to the implantation of an ESD power supply clamp across the power rails so that the ESD event will be discharged through the clamp, and thus protection of the circuit core can be achieved. An ESD power clamp using backside power rail processing has been disclosed where the passive device components (i.e., resistor and capacitor) are located on a backside of the wafer and the transistors are located on the frontside of the wafer, and through-silicon vias are used to electrically connect the transistors to the backside power rails. The present application provides a semiconductor structure in which the through-silicon vias are eliminated. In the present application, a backside extension contact structure is used to provide contact between a shared gate structure of an inverter and backside power rails. This use of backside extension contact structure provides space saving and can be easily implemented during backside processing of the structure. The semiconductor structure of the present application further includes a high-current capacity field effect transistor (FET) that enables, through Extreme Ultraviolet patterning technology, the use of the ESD power claim device for better discharge capability under an ESD stress condition. In the present application, the inverter and high-current capacity FET are located on a frontside of the wafer, while the passive device, the backside extension contact structure and the backside power rails are all located on the backside of the wafer. These and other aspects and advantages of the present application will now be described in greater detail.

Figure 1B:
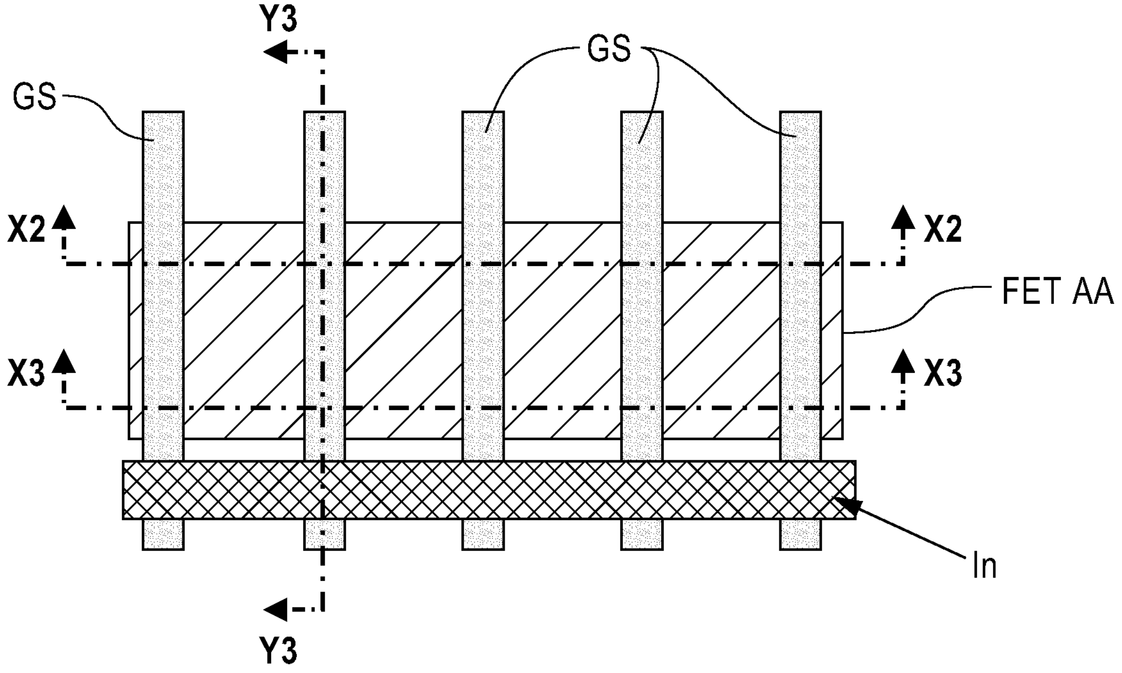
FIG. 1B is a top down view illustrating a device layout for a second region of the semiconductor structure in accordance with the present application and including cuts X2-X2, X3-X3, and Y3-Y3.

Reference is first made to FIG. 1A which illustrates a device layout for a first region of a semiconductor structure in accordance with the present application and including cuts X1-X1, Y1-Y1, and Y2-Y2, and FIG. 1B which illustrates a device layout for a second region of the semiconductor structure in accordance with the present application and including cuts X2-X2, X3-X3, and Y3-Y3. The first region and the second region are located adjacent to each other and include different types of devices. Notably, the first region is a region of the semiconductor structure in which an inverter and a passive device are housed, while the second region is a region of the semiconductor structure in which a power rail clamping FET is housed. The inverter which is located on a frontside of the wafer includes a pFET and an nFET having a shared gate structure and the passive device which is located on the backside of the wafer includes a capacitor and a resistor. The structure can further include a power rail clamping FET having a larger gate length than the pFET and nFET of the inverter. The conductivity type of the power rail clamping FET can be either n-type or p-type. The power rail clamping FET has a higher current capacity than the nFET and pFET of the inverter and thus the power rail clamping FET can be referred to as a high-current capacity FET.

Reverting back to the first region shown in FIG. 1A, this first region includes a pFET active area (pFET AA) spaced apart from, and oriented parallel to, an nFET active area (nFET AA). This first region also includes a plurality of gate structures, GS, that are oriented parallel to each other and perpendicular to pFET AA and nFET AA. Also shown in FIG. 1A is frontside contact structure, CS, in which current flows out from. As mentioned above, FIG. 1A includes three cuts, namely cuts X1-X1, Y1-Y1, and Y2-Y2. Cut X1-X1 is located in a middle portion of pFET AA and it runs along a length-wise direction of pFET AA. Cut Y1-Y1 is located in a middle portion of one of the gate structures and it runs along a length-wise direction of that gate structure. Cut Y2-Y2 is located in a middle portion of a source/drain region that is located between two gate structures. As is shown cuts Y1-Y1, and Y2-Y2 lie perpendicular to X1-X1.

Reverting back to the second region shown in FIG. 1B, this second region includes a FET active area (FET AA); FET AA has a larger width than either nFET AA or pFET AA. This second region also includes a plurality of gate structures, GS, that are oriented parallel to each other and perpendicular to FET AA. Also shown in FIG. 1B is frontside contact structure, CS, in which current flows into. As mentioned above, FIG. 1B includes three cuts, namely cuts X2-X2, X3-X3, and Y3-Y3. Cut X2-X2 is located at an end portion of FET AA and it runs along a length-wise direction of FET AA, while Cut X-X3 is located at other end portion FET AA and it runs along a length-wise direction of FET AA. Cut Y2-Y2 is located in a middle portion of one of the gate structures and it runs along a length-wise direction of that gate structure. As is shown cut Y3-Y3 lies perpendicular to X2-X2 and X3-X3. It is noted that X1-X1, X2-X2 and X3-X3 are lie in a same direction, while Y1-Y1, Y2-Y2 and Y3-Y3 are lie in a same direction and that the direction in which each of Y1-Y1, Y2-Y2 and Y3-Y3 lie is perpendicular to the direction in which each of X1-X1, X2-X2 and X3-X3 lie.

Figure 2A:
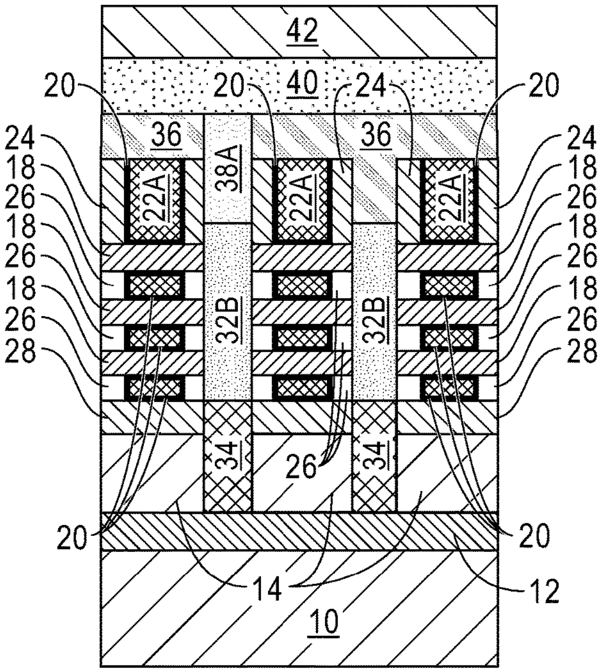
FIGS. 2A, 2B and 2C are cross sectional views through cuts X1-X1, Y1-Y1, and Y2-Y2, shown in FIG. 1A respectively, of an exemplary structure that can be present in the first region, the exemplary structure in the first region includes an inverter including a pFET and an nFET having a shared gate structure and located on a frontside of a substrate (i.e. wafer).
Figure 2B:
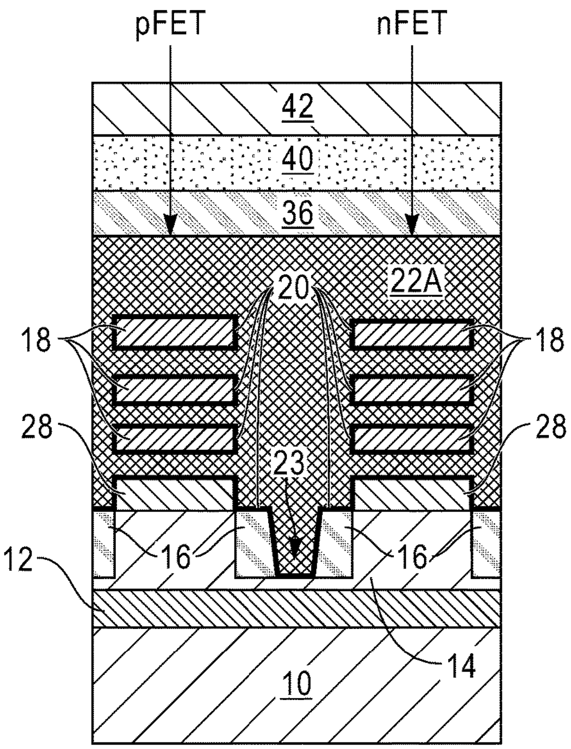
Figure 2C:
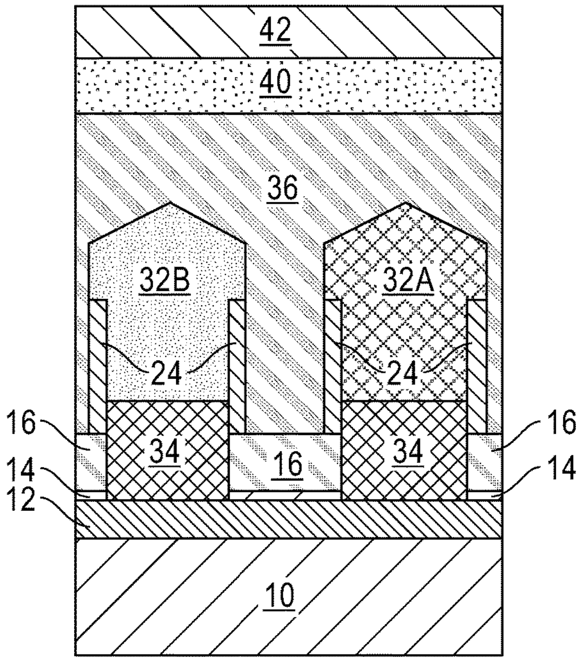
Figure 3A:
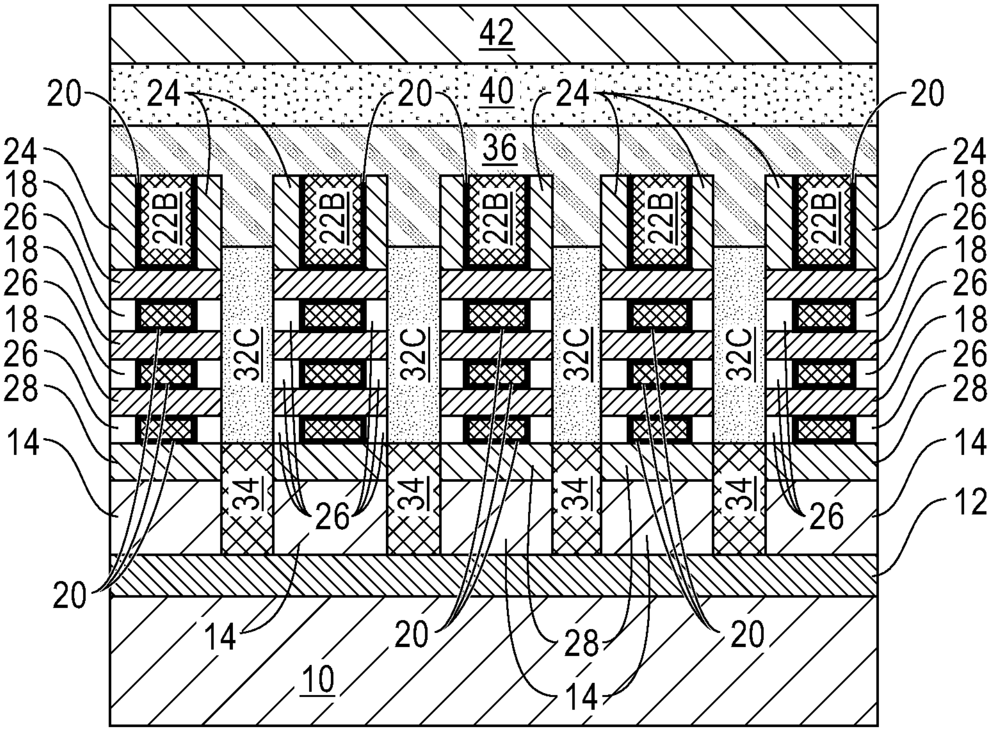
FIGS. 3A, 3B and 3C are cross sectional views through cuts X2-X2, X3-X3, and Y3-Y3, shown in FIG. 1B respectively, of an exemplary structure that can be present in the second region, the exemplary structure in the second region includes a power rail clamping FET having a larger gate length than the pFET and nFET of the inverter and located on the frontside of the substrate.
Figure 3B:
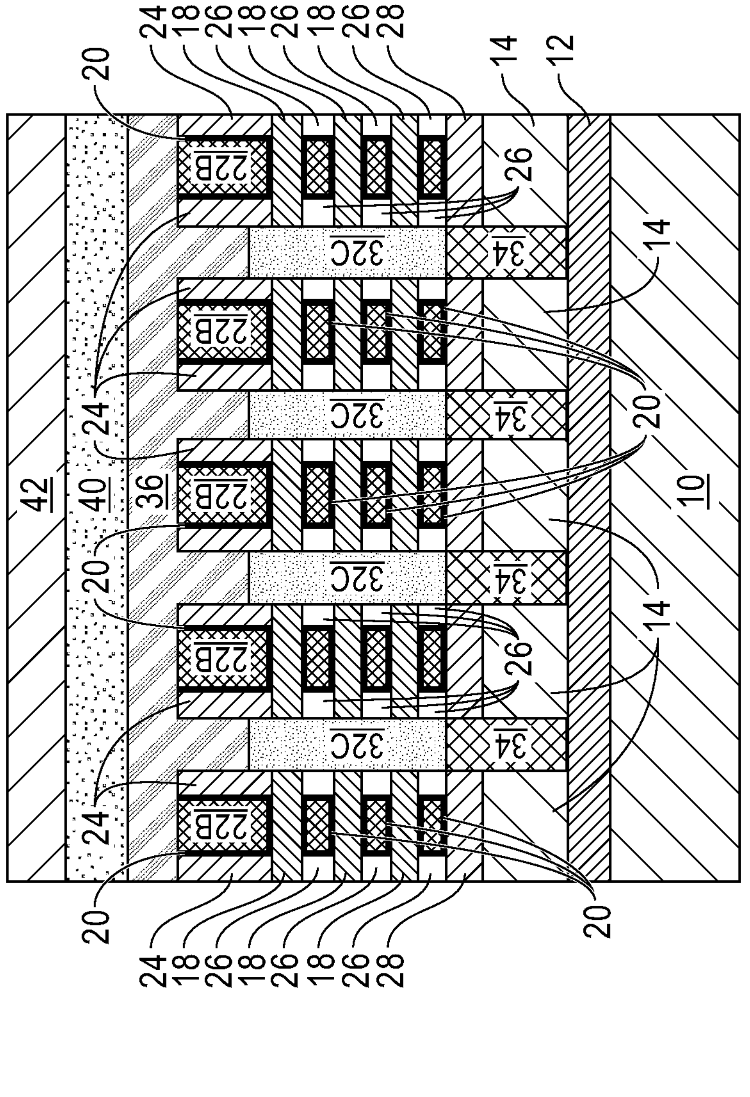
Figure 3C:
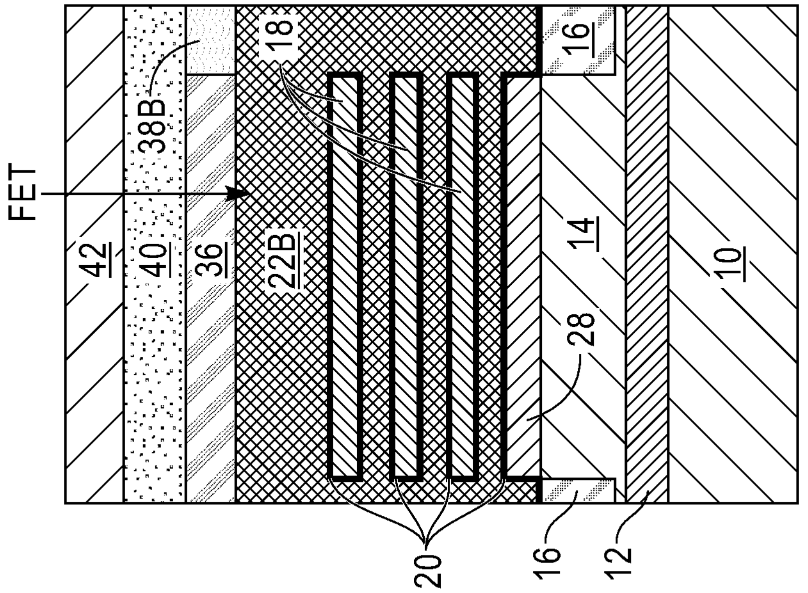

Referring now to FIGS. 2A, 2B and 2C, there are illustrated through cuts X1-X1, Y1-Y1, and Y2-Y2, shown in FIG. 1A respectively, of an exemplary structure that can be present in the first region. The exemplary structure in the first region includes an inverter including a pFET and an nFET having a shared gate structure and located on a frontside of a substrate (i.e., wafer). FIGS. 3A, 3B and 3C illustrate through cuts X2-X2, X3-X3, and Y3-Y3, shown in FIG. 1B respectively, of an exemplary structure that can be present in the second region. The exemplary structure in the second region includes a power rail clamping FET having a larger gate length than the pFET and nFET of the inverter and located on the frontside of the substrate. Each of FIGS. 2A-2C and FIGS. 3A-3C shows the exemplary structures in the different regions after front-end-of-the-line (FEOL) processing, middle-of-the-line (MOL) processing and BEOL processing have been performed.

Notably, and as mentioned above, each of the exemplary structures shown in the first and second regions are both located on the frontside of the substrate; the frontside is the side of the substrate (i.e., wafer) in which the various transistors are located. In the illustrated embodiment, the substrate can include a first semiconductor layer 10, an etch stop layer 12, and a second semiconductor layer 14. In other embodiments, the etch stop layer 12 and the second semiconductor layer 14 can be omitted and in such embodiments, the substrate is composed of the first semiconductor layer 10. In yet other embodiments, the etch stop layer 12 can be omitted and in such embodiments, the substrate is composed of the first semiconductor layer 10 and the second semiconductor layer 14 (in such embodiments the semiconductor material that provides the first and second semiconductor layers 10, 14 are compositionally different from each other).

The first semiconductor layer 10 is composed of a first semiconductor material. The second semiconductor layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the second semiconductor layer 14 can be compositionally the same as, or compositionally different from, the first semiconductor material that provides the first semiconductor layer 10. In some embodiments of the present application, the etch stop layer 12 can be composed of a dielectric material such as, for example, silicon dioxide and/or boron nitride. In other embodiments of the present application, the etch stop layer 12 is composed of a third semiconductor material that is compositionally different from the first semiconductor material that provides the first semiconductor layer 10 and the second semiconductor material that provides the second semiconductor layer 14. In one example, the first semiconductor layer 10 is composed of silicon, the etch stop layer 12 is composed of silicon dioxide, and the second semiconductor layer 14 is composed of silicon. In another example, the first semiconductor layer 10 is composed of silicon, the etch stop layer 12 is composed of silicon germanium, and the second semiconductor layer 14 is composed of silicon.

The substrate including the first semiconductor layer 10, the etch stop layer 12 and the second semiconductor layer 14 can be formed utilizing techniques well known to those skilled in the art. For example, the substrate including the first semiconductor layer 10, the etch stop layer 12 and the second semiconductor layer 14 can be formed by a separation by ion implantation of oxygen process, or wafer bonding.

The exemplary structures shown in the first and second regions also include a shallow trench isolation structure 16 that is located in an upper portion of the substrate (in the illustrated embodiment, the shallow trench isolation structure 16 is located in an upper portion of the second semiconductor layer 14). The shallow trench isolation structure 16 is composed of any trench dielectric material such as, for example, silicon oxide. In some embodiments, a trench dielectric liner composed of, for example, SiN, can be present along a sidewall and a bottom wall of the trench dielectric material. The shallow trench isolation structure 16 can have a topmost surface that is coplanar with a topmost surface of the non-etched portion of the substrate; in the illustrated embodiment the shallow trench isolation structure 16 can have a topmost surface that is coplanar with a topmost surface of the non-etched portion of the second semiconductor layer 14. The shallow trench isolation structure 16 can be formed by first forming (by lithography and etching) a trench in an upper portion of the substrate (in the illustrated embodiment the trench is formed into an upper portion of the second semiconductor layer 14), depositing the optional trench dielectric liner material and the trench dielectric material in the trench, and thereafter performing an etch back process.

In the illustrated embodiment shown in FIGS. 2A-2C and FIGS. 3A-3C, the nFET and pFET that are located in the first region and the power rail clamping FET that is located in the second region are each nanosheet-containing transistors. The term "nanosheet containing transistors" denotes transistors in which a gate structure is wrapped around a plurality of semiconductor channel material nanosheets 18. Such transistors typically include gate spacer 24, inner spacer 26, bottom dielectric isolation layer 28 and source/drain regions 32A, 32B, 32C. The nanosheet containing transistors can be formed utilizing nanosheet transistor formation processes that are well known to those skilled in the art. The gate structure includes a gate dielectric layer 20 and a gate electrode 22A, 22B. In the first region and as shown in FIG. 2B, gate electrode 22A is shared between the nFET and the pFET; thus gate electrode 22A represents a gate electrode of a shared gate structure. In the second region, the gate structure includes gate electrode 22B. In the second region, the gate structure of the power rail clamping FET has a larger gate length than the pFET and nFET of the inverter.

In the present application, the shared gate structure in the first region includes a via extension portion 23 that extends though the shallow trench isolation structure 16 and contacts a subsurface of the semiconductor device layer 14. The via extension portion 23 of the shared gate structure is laterally surrounded by one of the shallow trench isolation structures 16. The via extension portion 23 of the shared gate structure includes both the gate dielectric layer 20 and gate electrode 22A.

Although the present application describes and illustrates nanosheet containing transistors as being used in each of the first region and the second region, the present application is not limited to using the same. Instead other types of non-planar transistors (such as, for example, nanowire FETs and finFETs) and/or non-planar transistors can be employed instead of the nanosheet containing transistors illustrated in the drawings of the present application.

The semiconductor channel material nanosheets 18 that provide each of the nanosheet-containing transistors include a semiconductor channel material such as, for example, silicon or a silicon germanium alloy. The semiconductor channel material nanosheets 18 of the nFET can be composed of a compositionally same or compositionally different semiconductor channel material than the semiconductor channel material that provides the semiconductor channel material nanosheets 18 of the pFET. In one example, the semiconductor channel material that provides each semiconductor channel material nanosheet 18 of the nFET is capable of providing high channel mobility for the nFET, while the semiconductor channel material that provides each semiconductor channel material nanosheet 18 of the pFET is capable of providing high channel mobility for the pFET. The semiconductor channel material that provides the semiconductor channel material nanosheets 18 of the power rail clamping FET can be compositionally the same as, or compositionally different from the semiconductor channel material that provides the semiconductor channel material nanosheets 18 of the nFETs and/or the semiconductor channel material that provides the semiconductor channel material nanosheets 18 of the pFETs.

The gate dielectric layer 20 of each of the nFET, the pFET and the power rail clamping FET illustrated in the drawings of the present application is composed of a gate dielectric material as defined below. The gate dielectric layer 20 directly contacts a physically exposed surface(s) of each semiconductor channel material nanosheet 18, and the gate electrode 22A, 22B is formed on the gate dielectric material. The gate dielectric material has a dielectric constant of 4.0 or greater. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg).

The gate electrode 22A, 22B can include at least one of a work function metal (WFM) and a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 cV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 cV to 5.2 cV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The conductive metal can include, but is not limited to aluminum (Al), tungsten (W), or cobalt (Co).

Each of the gate spacer 24, inner spacer 26 and bottom dielectric isolation layer 28 is composed of a dielectric spacer material. The gate spacer 24 and the bottom dielectric isolation layer 28 are composed of a same dielectric spacer material, and are of unitary construction. The inner spacer 26 can be composed of a compositionally same, or compositionally different, dielectric spacer material than the gate spacer 24 and bottom dielectric isolation layer 28. Exemplary dielectric spacer materials that can be used include, but are not limited to, silicon dioxide, SiN, SiBCN, SiOCN or SiOC.

Each of the pFET, the nFET and the power rail clamping FET includes a source region and a drain region (hereinafter collectively referred to as source/drain regions). The source/drain regions are typically formed by an epitaxial growth process. Each source/drain region extends outward from a sidewall of each semiconductor channel material nanosheet 18, and is present on a backside contact placeholder material 34. Each of the source/drain regions is composed of a semiconductor material and a dopant. The semiconductor material that provides each of the source/drain regions is composed of one of the semiconductor materials mentioned above. The semiconductor material that provides the source/drain regions can be compositionally the same, or compositionally different from each semiconductor channel material nanosheet 18. The dopant that is present in the source/drain regions can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the source/drain regions can have a dopant concentration of from $4\times10^{20}$ atoms/cm$^3$ to $3\times10^{21}$ atoms/cm$^3$. In the present application, source/drain regions 32A include an n-type dopant and are used as a component of the nFET, source/drain regions 32B include a p-type dopant and are used as a component of the pFET, while source/drain region 32C (either n-type doped or p-type doped) is used as a component of the power rail clamping FET.

The backside contact placeholder material 34 is composed of a sacrificial material such as, for example, SiGe, TiOx, or AlOx. The backside contact placeholder material 34 can be formed in selective locations of the structure by etching through the bottom dielectric isolation layer 28 and an upper portion of the substrate (in the illustrated embodiment this etch is through an upper portion of the second semiconductor layer 14) that does not include the shallow trench isolation structure 16. The opening created by this etch is then filled (by a deposition process such as, for example, epitaxy, chemical vapor deposition (CVD) or plasma enhanced chemical vapor deposition (PECVD)) with a sacrificial material as defined above and a recess etch can be performed to provide the backside contact placeholder material 34 shown in FIGS. 2A-2C and 3A-3C of the present application.

The exemplary structures in both the first region and second region include frontside interlayer dielectric (ILD) layer 36. The frontside ILD layer 36 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). The frontside ILD layer 36 can be formed by a deposition process including, by not limited to, CVD, PECVD or spin-on coating. A planarization process such as, for example, chemical mechanical polishing (CMP) can follow the deposition process.

The exemplary structures in the first region and the second region further include a frontside contact structure 38A, 38B. The frontside contact structures 38A, 38B are formed utilizing a metallization process; frontside contact structure 38A is formed in the first region, while frontside contact structure 38B is formed in the second region. The metallization process can include forming frontside contact openings in frontside ILD layer 36, and thereafter filling (including deposition and planarization) each frontside contact opening with at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures 38A, 38B can also include one or more contact liners (not shown). In one or more embodiments, the contact liner (not shown) can include a diffusion barrier material. Exemplary diffusion barrier materials include, but are not limited to, Ti, Ta, Ni, Co. Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. Each frontside contact structures 38A that is present is the first region contacts a source/drain region that is located directly the backside contact placeholder material 34 (thus frontside contact structures 38A can be referred to herein as frontside source/drain contact structures). The frontside contact structure 38B that is formed in the second region contacts a surface of the gate structure, i.e., gate electrode 22A, of the power rail clamping FET. Thus, the frontside contact structure in the second region can be referred to as a gate contact structure. The frontside contact structures 38A, 38B and the frontside ILD layer 36 represent a MOL structure.

A frontside BEOL structure 40 is located in both the first region and the second region. The frontside BEOL structure 40 can include one or more interconnect dielectric material layers (including one of the dielectric materials mentioned above for the frontside ILD layer 36) that contain one or more wiring regions (the wiring regions can include any electrically conductive metal or electrically conductive metal alloy) embedded therein. The frontside BEOL structure 40 can be formed utilizing any interconnect device processing technique. In some embodiments, the wiring regions are Cu wiring regions. The carrier wafer 42 can include one of the semiconductor materials mentioned above for the first semiconductor layer 10. Carrier wafer 42 is bonded to the frontside BEOL structure 40 after frontside BEOL structure 40 formation.

Figure 4A:
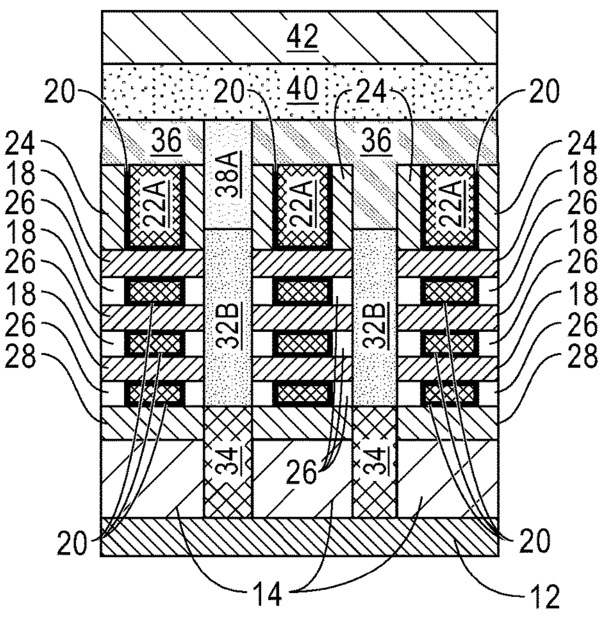
FIGS. 4A, 4B and 4C are cross sectional views of the exemplary structure shown in FIGS. 2A, 2B and 2C, respectively, after removing a first semiconductor layer of the substrate to physically expose an etch stop layer of the substrate in the first region.
Figure 4B:
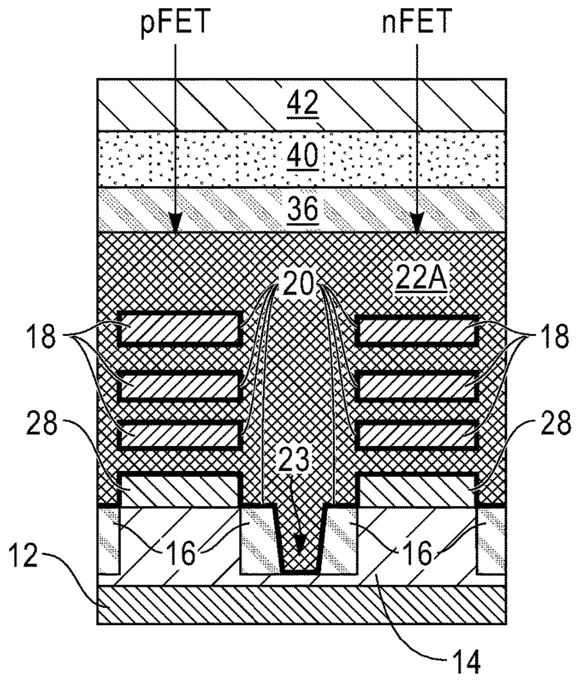
Figure 4C:
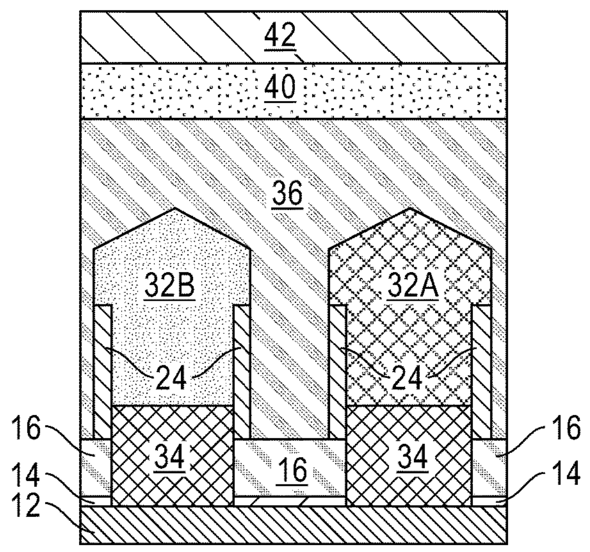
Figure 5A:
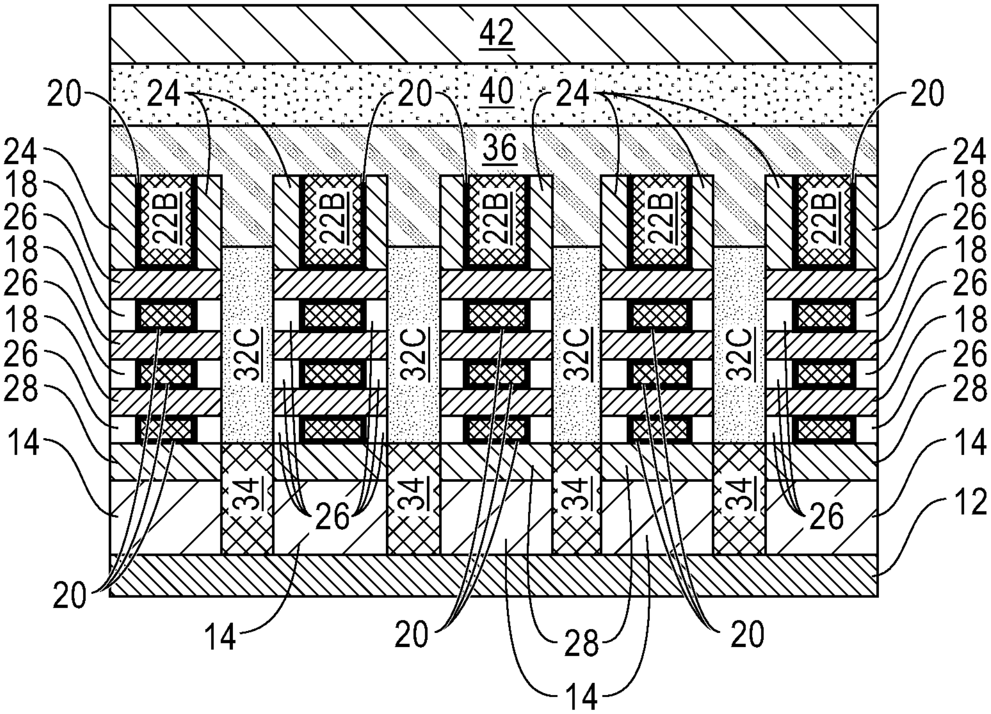
FIGS. 5A, 5B and 5C are cross sectional views of the exemplary structure shown in FIGS. 3A, 3B and 3C, respectively, after removing the first semiconductor layer of the substrate to physically expose the etch stop layer of the substrate in the second region.
Figure 5C:
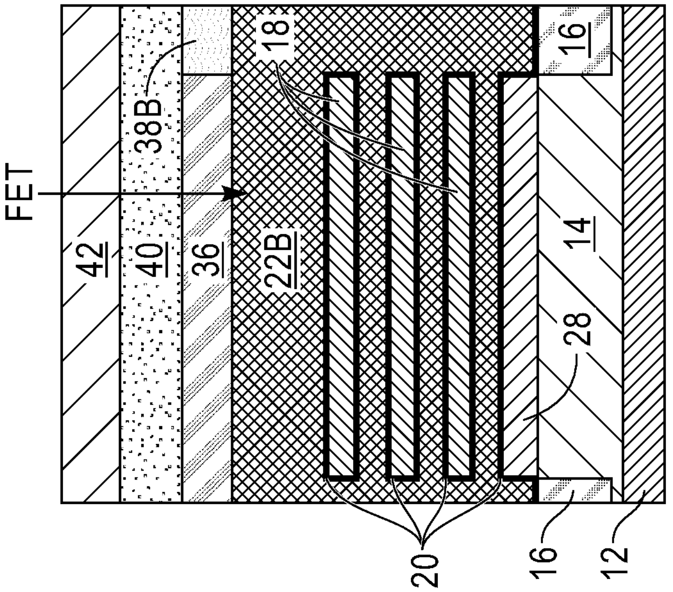
Figure 5B:
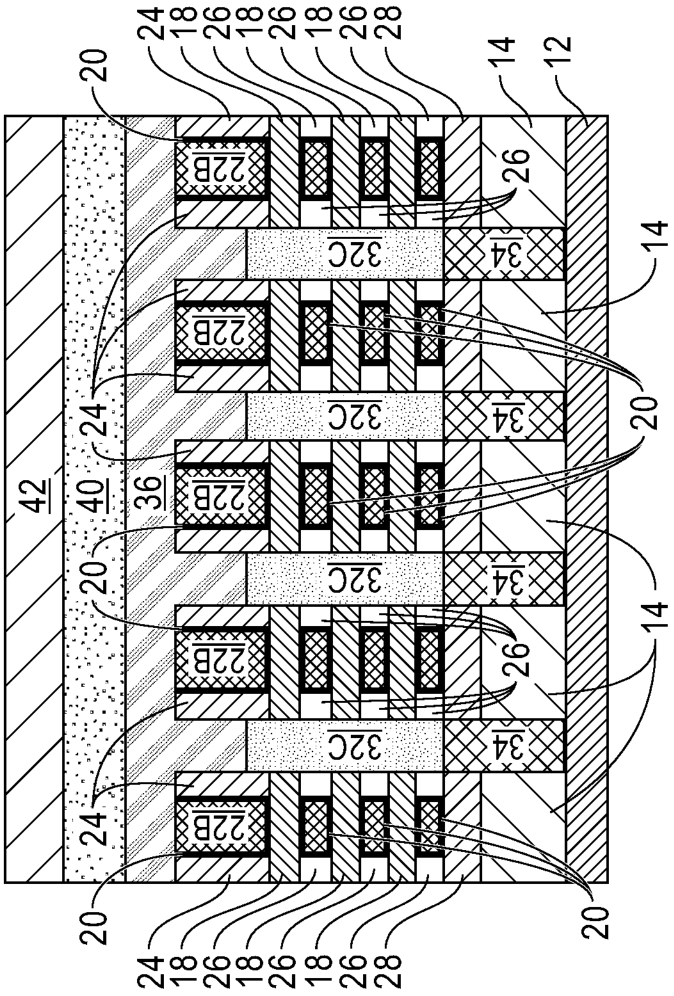

Referring now to FIGS. 4A, 4B and 4C, there are illustrated the exemplary structure shown in FIGS. 2A, 2B and 2C, respectively, after removing the first semiconductor layer 10 of the substrate to physically expose the etch stop layer 12 of the substrate in the first region. FIGS. 5A, 5B and 5C illustrate the exemplary structure shown in FIGS. 3A, 3B and 3C, respectively, after removing the first semiconductor layer 10 of the substrate to physically expose the etch stop layer 12 of the substrate in the second region. The removal steps occur simultaneously since the first and second regions are located on a same substrate.

The removal of the first semiconductor layer 10 typically includes flipping the structure 180° to physically expose a backside of the substrate. This flipping step is not shown in the drawings of the present application for clarity. Flipping step will allow backside processing of the exemplary structures in both the first region and second region. Backside processing occurs on a side of a wafer opposite the side where the transistors have been formed. Flipping of the structure can be performed by hand or by utilizing a mechanical means such as, for example, a robot arm. In the illustrated embodiment, the removal of the first semiconductor layer 10 of the substrate physically exposes the etch stop layer 12 of the substrate. The removal of the first semiconductor layer 10 of the substrate can be performed utilizing a material removal process that is selective in removing the first semiconductor material that provides the first semiconductor layer 10.

Figure 6A:
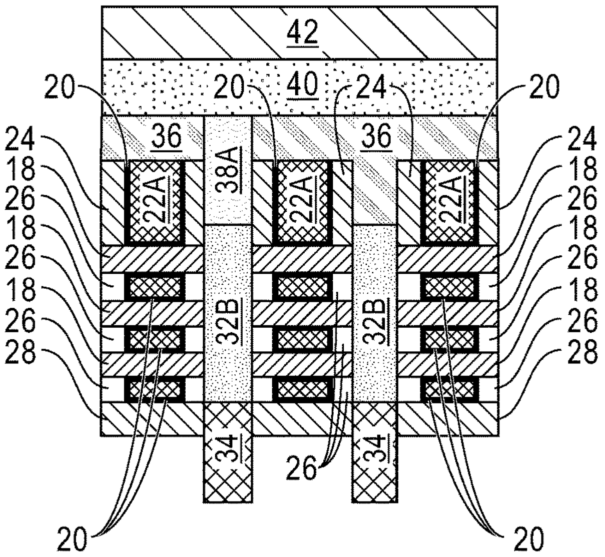
FIGS. 6A, 6B and 6C are cross sectional views of the exemplary structure shown in FIGS. 4A, 4B and 4C, respectively, after removing the etch stop layer and a second semiconductor layer of the substrate to physically expose a backside of the exemplary structure in the first region.
Figure 6B:
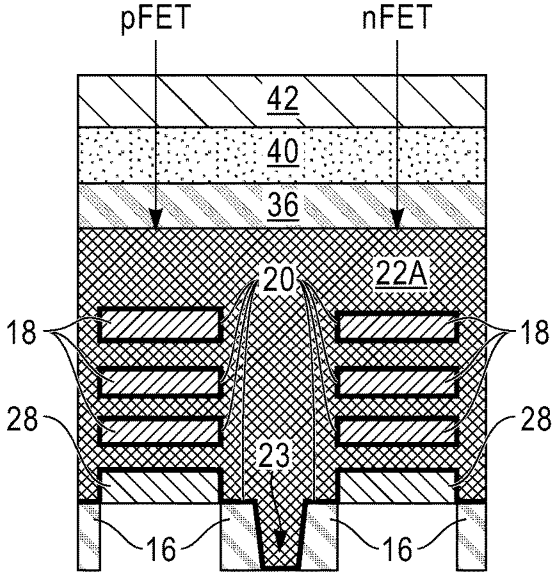
Figure 6C:
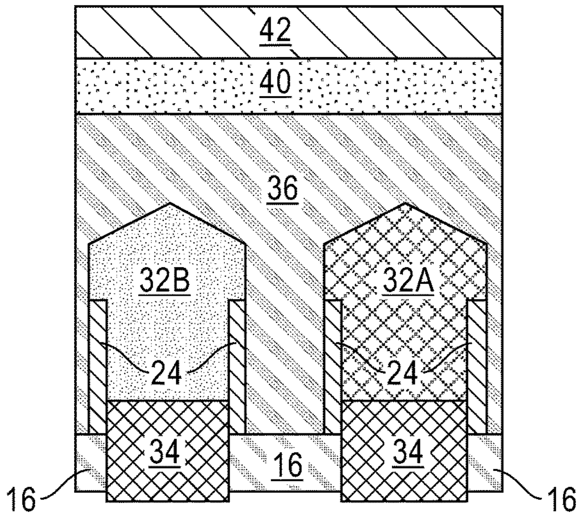
Figure 7A:
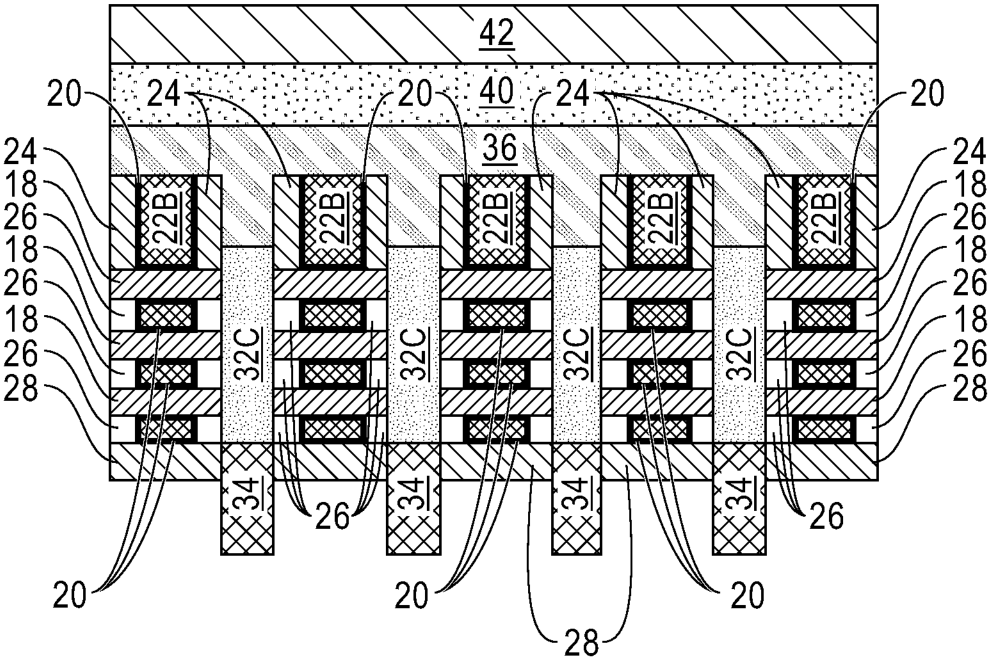
FIGS. 7A, 7B and 7C are cross sectional views of the exemplary structure shown in FIGS. 5A, 5B and 5C, respectively, after removing the etch stop layer and the second semiconductor layer of the substrate to physically expose a backside of the exemplary structure in the second region.
Figure 7C:
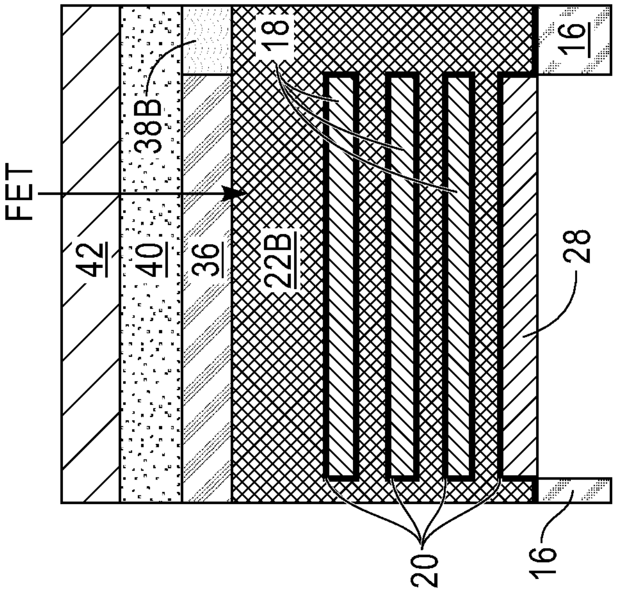
Figure 7B:
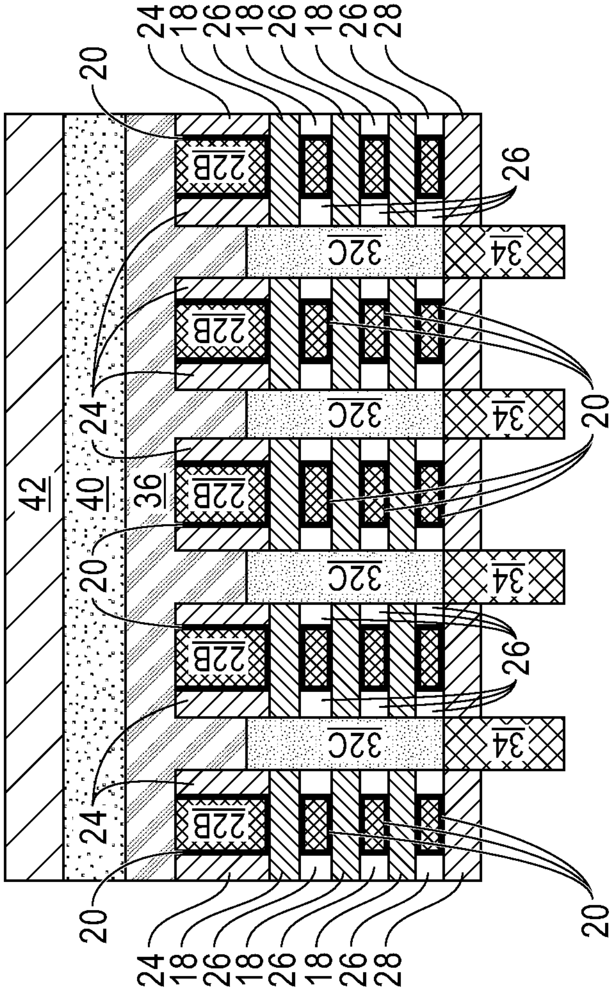

Referring now to FIGS. 6A, 6B and 6C, there are illustrated the exemplary structure shown in FIGS. 4A, 4B and 4C, respectively, after removing the etch stop layer 12 and the second semiconductor layer 14 of the substrate to physically expose a backside of the exemplary structure in the first region. FIGS. 7A, 7B and 7C illustrate the exemplary structure shown in FIGS. 5A, 5B and 5C, respectively, after performing the same to the second region.

The removal of the etch stop layer 12 from both the first region and the second region includes a material removal process that is selective in removing the etch stop layer 12. The removal of the etch stop layer 12 physically exposes the second semiconductor layer 14 of the substrate. The physically exposed second semiconductor layer 14 of the substrate can be removed utilizing a material removal process that is selective in removing that layer from the structure. Other material removal processes can be used depending on the type of substrate used. For example, in some embodiments in which substrate is a composed entirely of one semiconductor material, one material removal process can be used instead of the multiple material removal processing steps described herein.

Figure 8A:
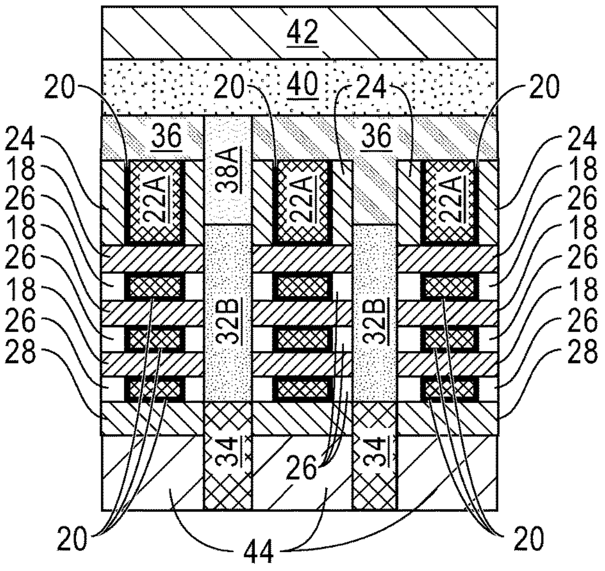
FIGS. 8A, 8B and 8C are cross sectional views of the exemplary structure shown in FIGS. 6A, 6B and 6C, respectively, after forming a first backside interlayer dielectric (ILD) layer in the first region.
Figure 8B:
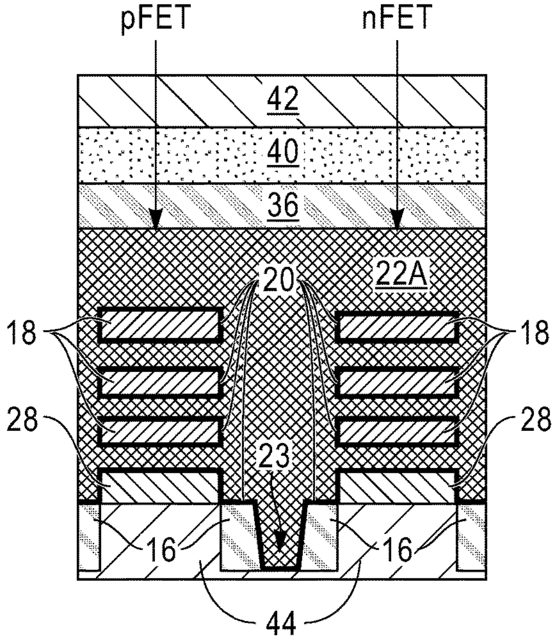
Figure 8C:
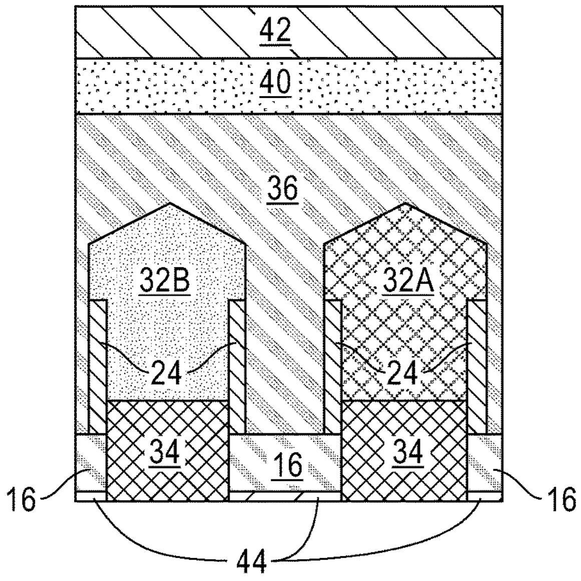
Figure 9A:
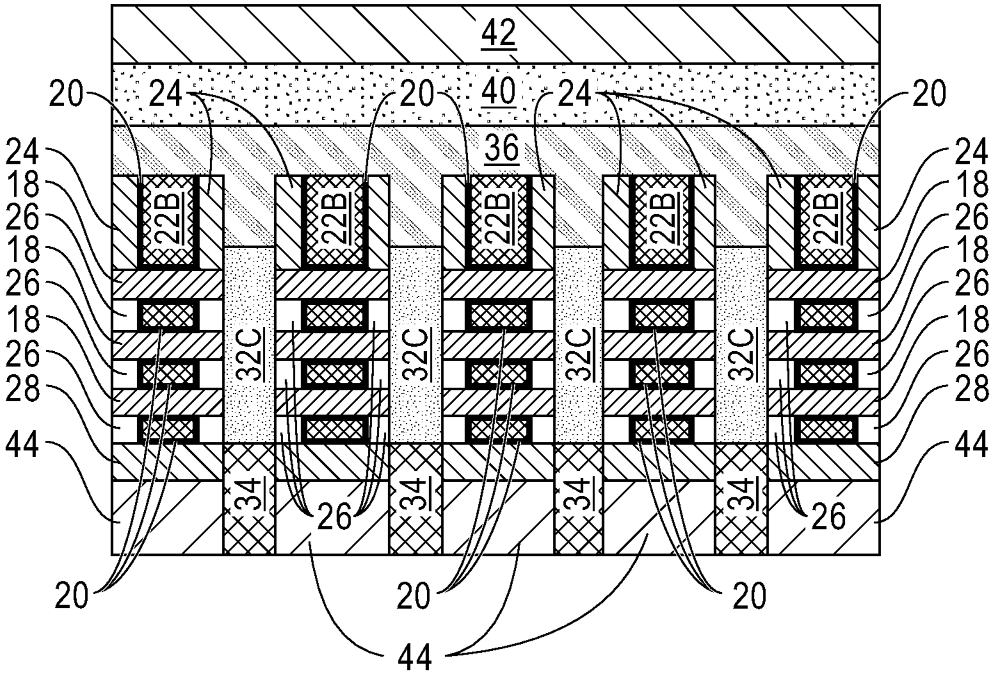
FIGS. 9A, 9B and 9C are cross sectional views of the exemplary structure shown in FIGS. 7A, 7B and 7C, respectively, after forming the first backside ILD layer in the second region.
Figure 9C:
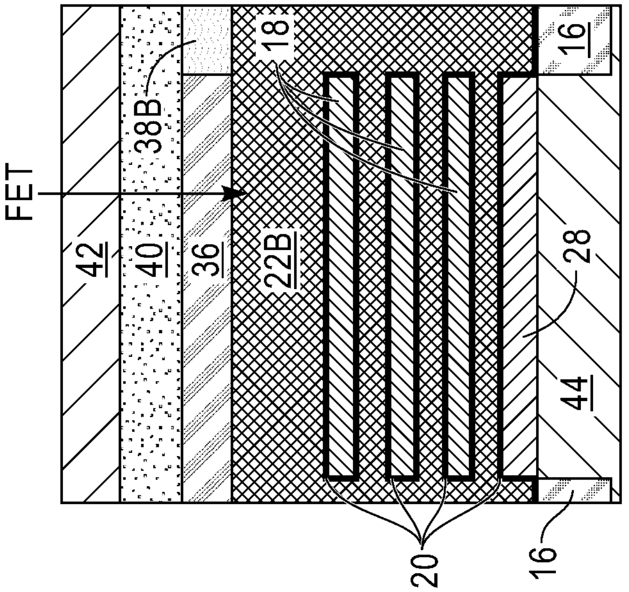
Figure 9B:
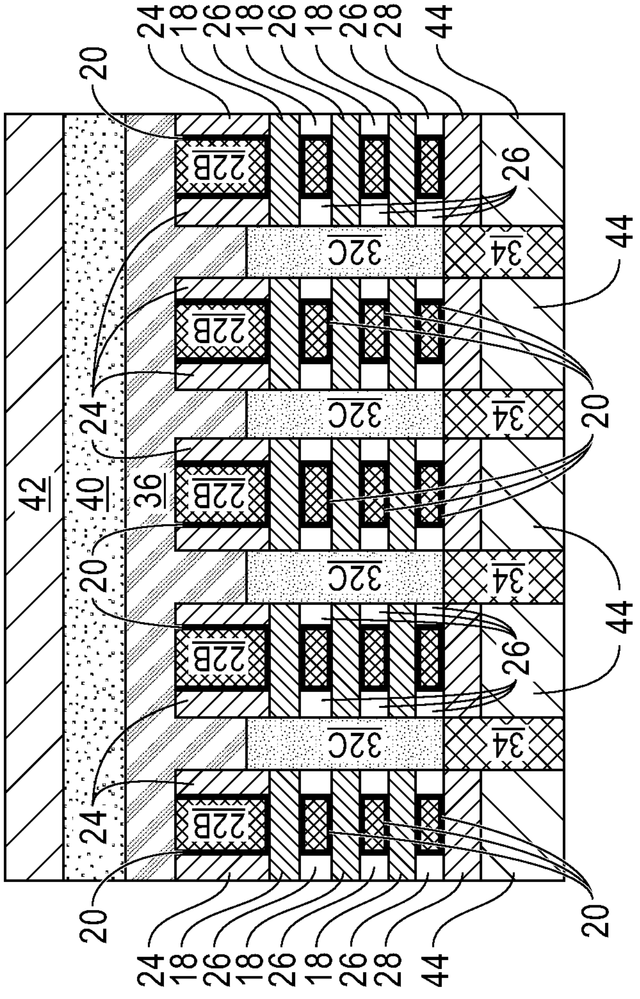

Referring now to FIGS. 8A, 8B and 8C, there are illustrated the exemplary structure shown in FIGS. 6A, 6B and 6C, respectively, after forming a first backside ILD layer 44 in the first region. FIGS. 9A, 9B and 9C illustrate the exemplary structure shown in FIGS. 7A, 7B and 7C, respectively, after forming the first backside ILD layer 44 in the second region. The first backside ILD layer 44 can include one of the dielectric materials mentioned above for the frontside ILD layer 36. The first backside ILD layer 44 can be formed utilizing one of the deposition processes mentioned above for forming the frontside ILD layer 36. A planarization process can follow the deposition process used in forming the first backside ILD layer 44. In the present application, the first backside ILD layer 44 has a surface that is coplanar with a surface of the backside contact placeholder material 34.

Figure 10A:
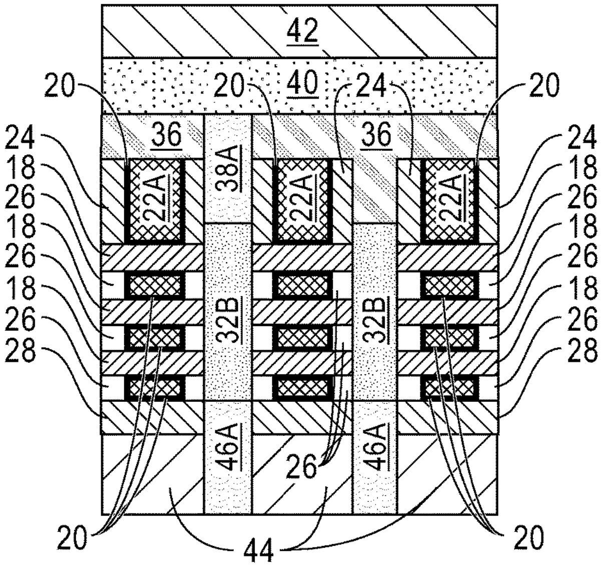
FIGS. 10A, 10B and 10C are cross sectional views of the exemplary structure shown in FIGS. 8A, 8B and 8C, respectively, after removing sacrificial placeholder material and forming backside source/drain contact structures in the first region.
Figure 10B:
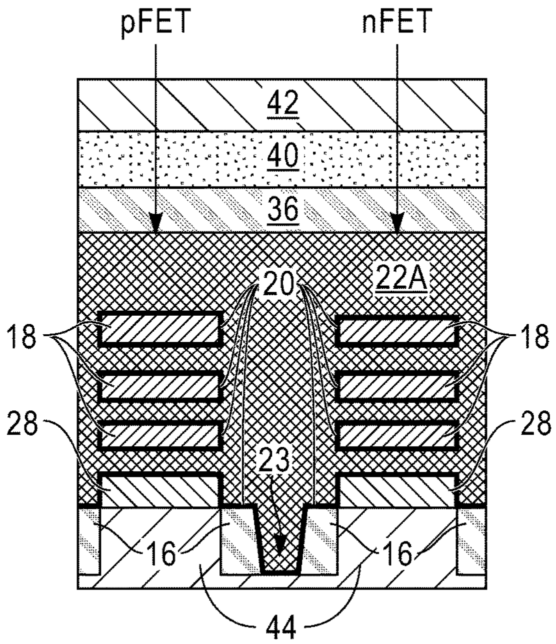
Figure 10C:
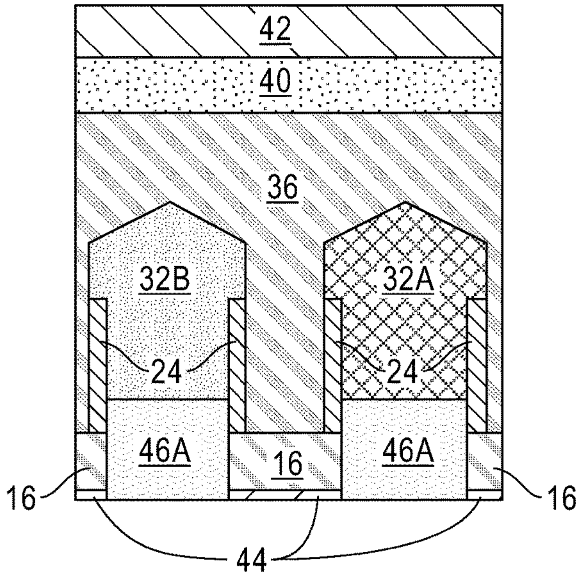
Figure 11A:
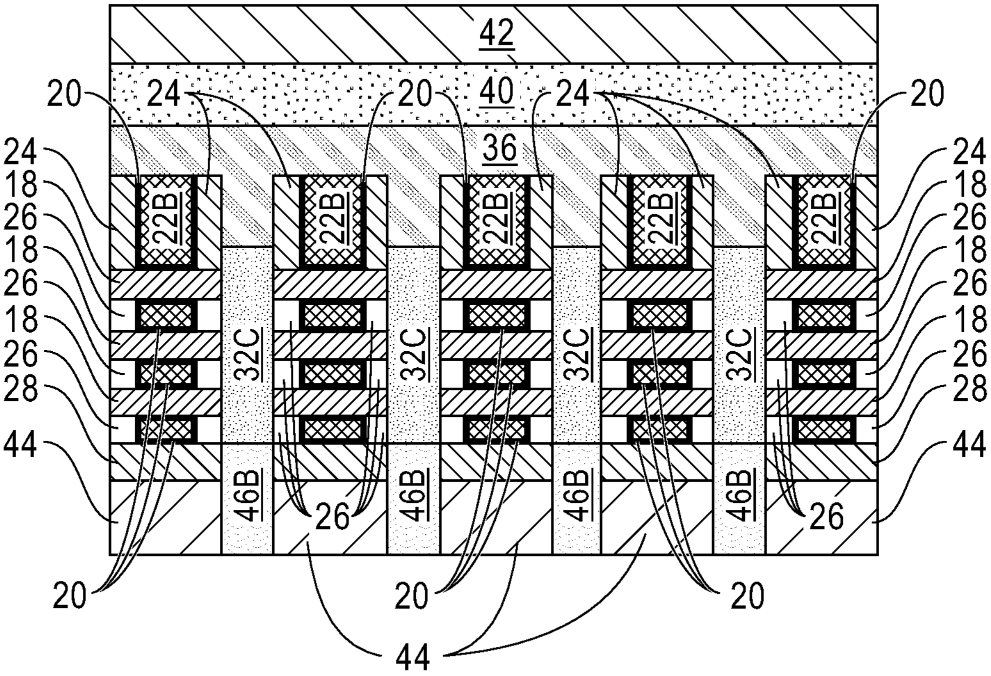
FIGS. 11A, 11B and 11C are cross sectional views of the exemplary structure shown in FIGS. 9A, 9B and 9C, respectively, after removing the sacrificial placeholder material and forming backside source/drain contact structures in the second region.
Figure 11C:
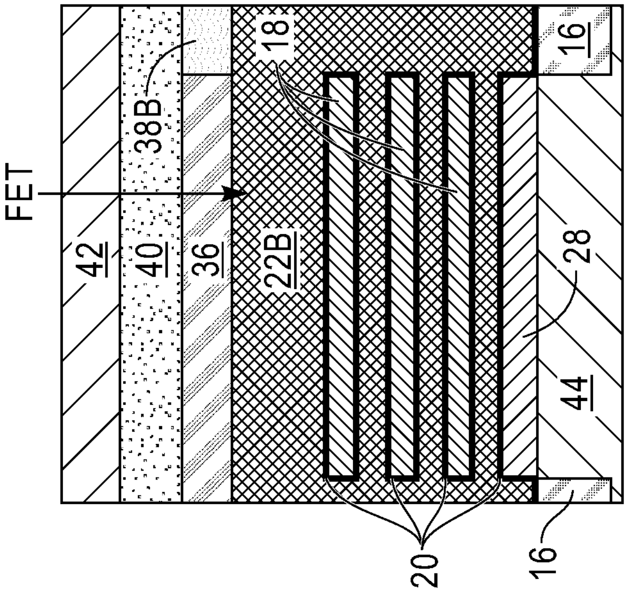
Figure 11B:
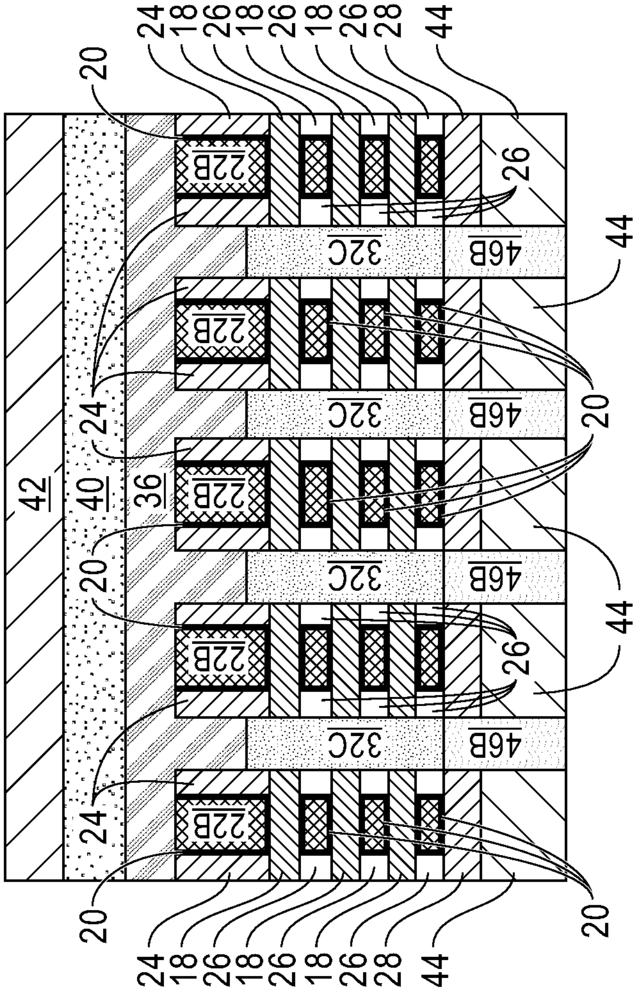

Referring now to FIGS. 10A, 10B and 10C, there are illustrated the exemplary structure shown in FIGS. 8A, 8B and 8C, respectively, after removing the backside contact placeholder material 34 and forming backside source/drain contact structures 46A in the first region. FIGS. 11A, 11B and 11C illustrate the exemplary structure shown in FIGS. 9A, 9B and 9C, respectively, after removing the backside contact placeholder material 34 and forming backside source/drain contact structures 46B in the second region.

The removal of the backside contact placeholder material 34 includes a material removal process such an etching that is selective in removing the backside contact placeholder material 34. Source/drain regions in the first region and the second region are physically exposed after removing the backside contact placeholder material 34. The backside source/drain contact structures 46A, 46B include materials as mentioned above for the frontside contact structures 38A, 38B. The backside source/drain contact structures 46A, 46B can be formed by a metallization process as defined above for the frontside contact structures 38A, 38B. The backside source/drain contact structures 46A, 46B have a surface the is coplanar with a surface of the first backside ILD layer 44.

Figure 12A:
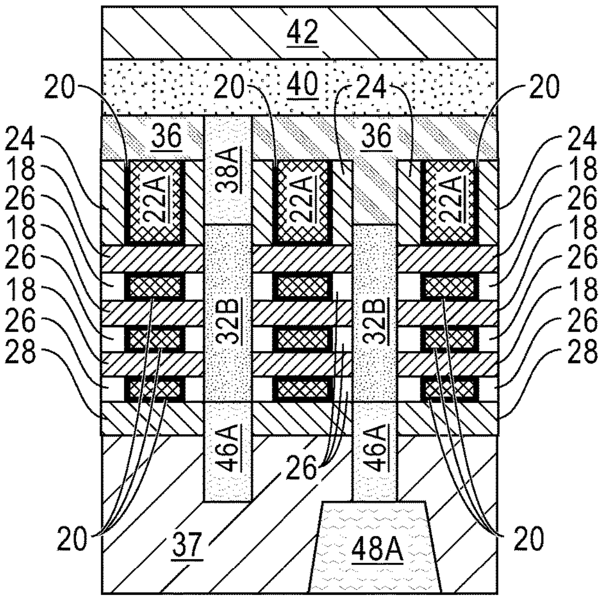
FIGS. 12A, 12B and 12C are cross sectional views of the exemplary structure shown in FIGS. 10A, 10B and 10C, respectively, after forming additional backside ILD material and backside metal via structures in the first region.
Figure 12B:
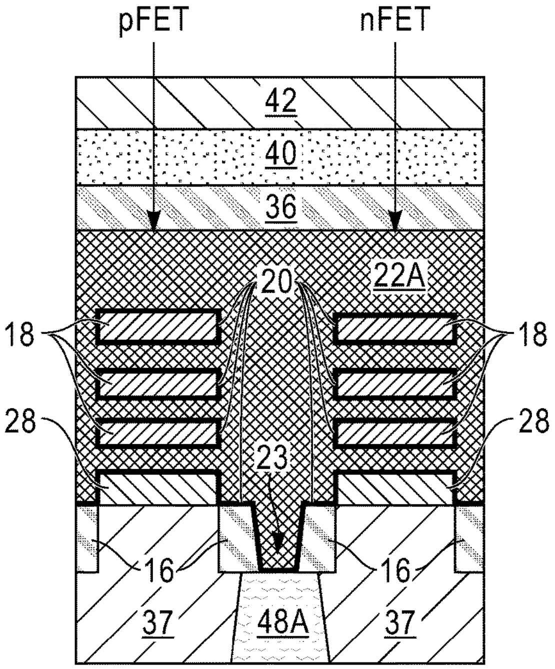
Figure 12C:
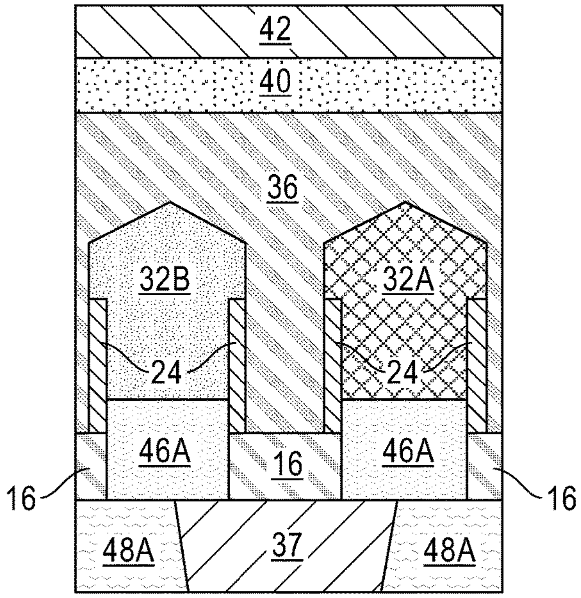
Figure 13A:
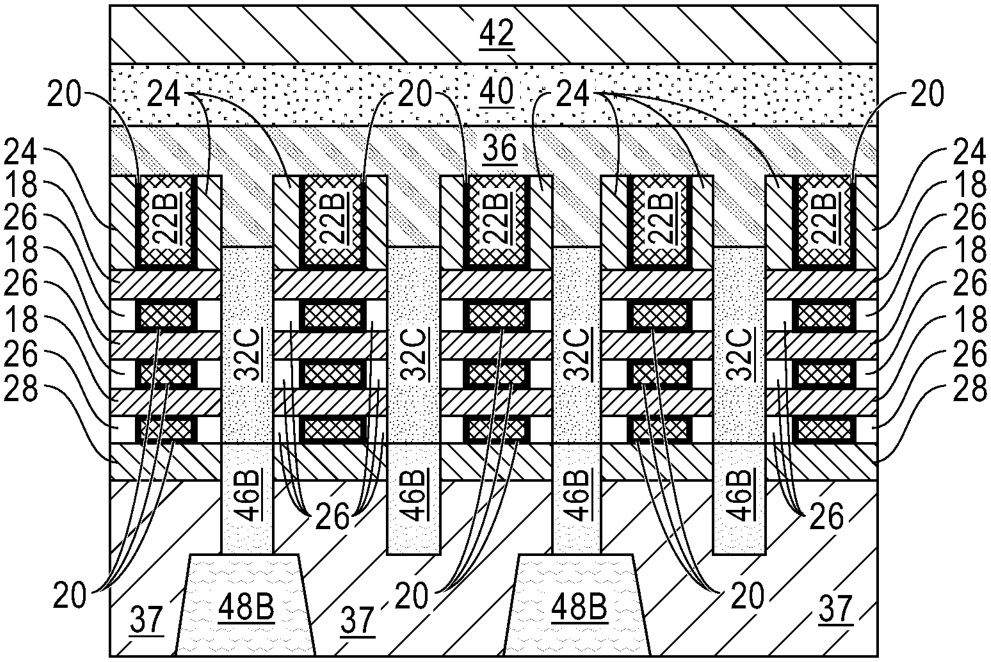
FIGS. 13A, 13B and 13C are cross sectional views of the exemplary structure shown in FIGS. 11A, 11B and 11C, respectively, after forming additional backside ILD material and backside metal via structures in the second region.
Figure 13B:
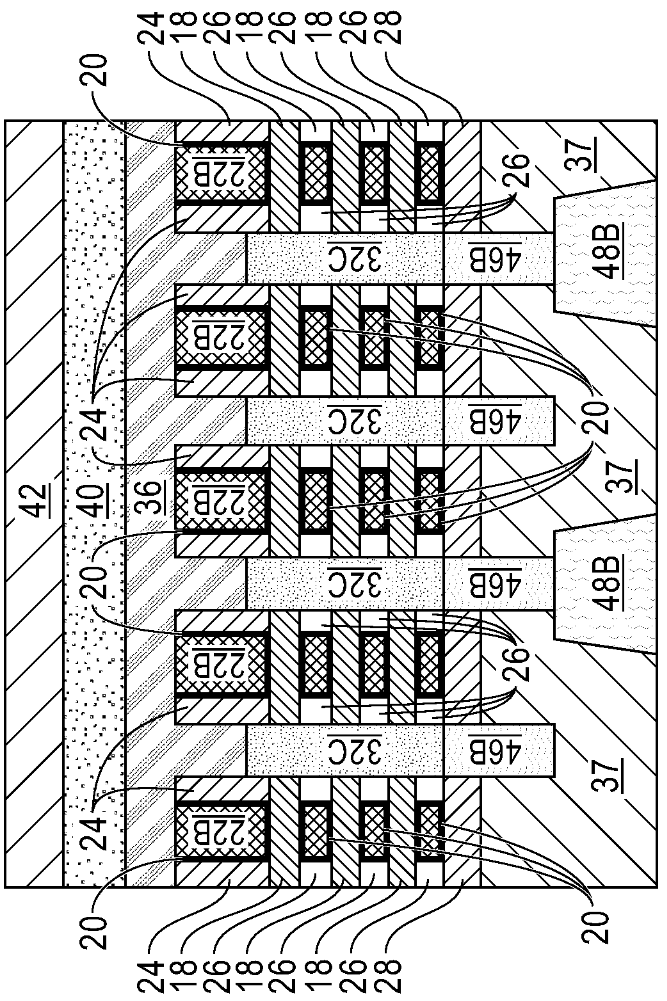
Figure 13C:
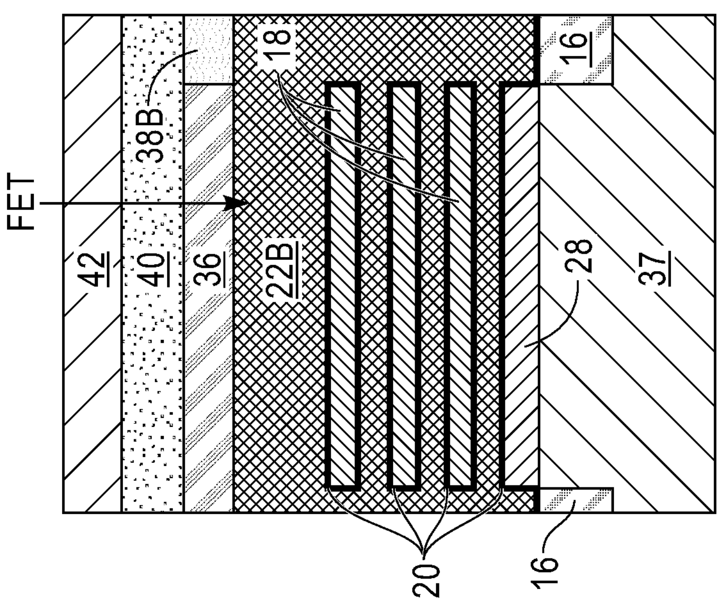

Referring now to FIGS. 12A, 12B and 12C, there are illustrated the exemplary structure shown in FIGS. 10A, 10B and 10C, respectively, after forming additional backside ILD material and backside metal via structures 48A in the first region. FIGS. 13A, 13B and 13C illustrate the exemplary structure shown in FIGS. 11A, 11B and 11C, respectively, after forming additional backside ILD material and backside metal via structures 48B in the second region.

The additional backside ILD material includes a compositionally same dielectric material as the first backside ILD layer 36. Collectively, the first backside ILD layer 36 and the additional backside ILD material provide a first backside ILD-containing layer 37. The additional backside ILD material can be formed utilizing one of the deposition processes mentioned above for the frontside ILD layer 36. The backside metal via structures 48A, 48B can be composed of an electrically conductive material. In some embodiments, backside metal via structures 48A, 48B can also include diffusion barrier liner. The diffusion barrier liner can include a diffusion barrier material such as, for example, Ti, TiN, Ta, and/or TaN and the electrically conductive material can include an electrically conductive metal such as, for example, tungsten (W), cobalt (Co), ruthenium (Ru), aluminum (Al), copper (Cu), platinum (Pt), rhodium (Rh), or palladium (Pd). Electrically conductive metal alloys such as for example Cu—Al can also be used as the electrically conductive material that provides the backside metal via structures 48A, 48B.

The backside metal via structures 48A, 48B can be formed utilizing a metallization process. This metallization process includes forming openings into the first backside ILD-containing layer 37. These openings are the filled to include the electrically conductive material and, optionally, diffusion barrier material. Note that at least one the backside metal via structures 48A in the first region contacts the via extension portion 23 of the shared gate structure. At least one other backside metal via structures 48A in the first region contacts one of backside source/drain contact structure 46A. Each backside metal via structure 48B contacts one of the backside source/drain contact structure 46B that is present in the second region.

Figure 14A:
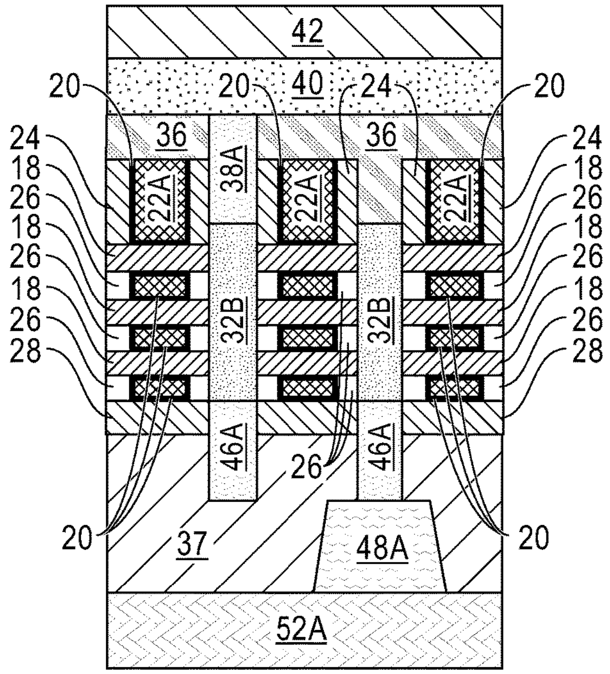
FIGS. 14A, 14B and 14C are cross sectional views of the exemplary structure shown in FIGS. 12A, 12B and 12C, respectively, after forming a first backside metal level including Vss power rails and Vdd power rails in the first region.
Figure 14B:
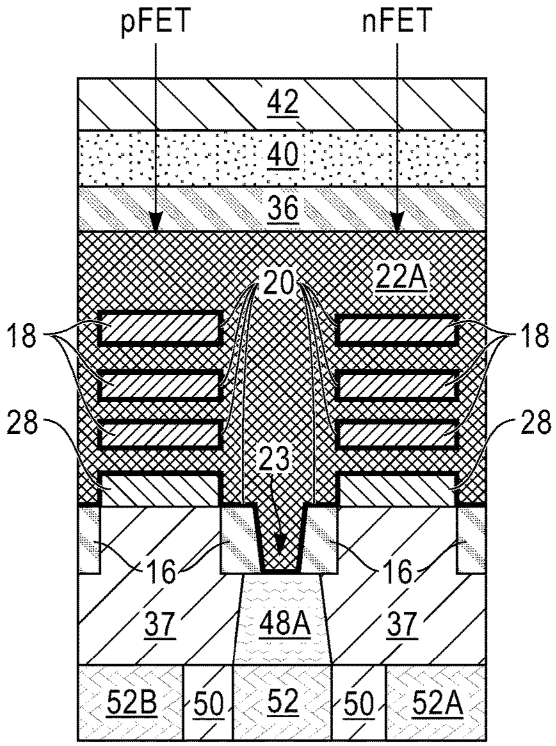
Figure 14C:
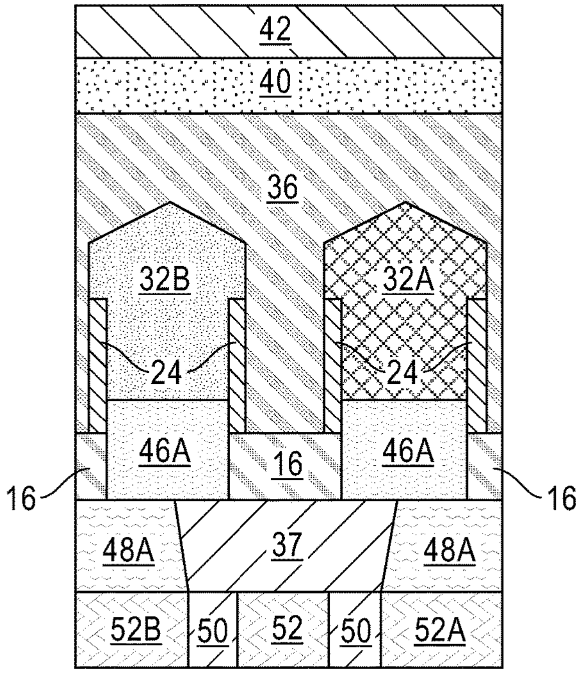
Figure 15A:
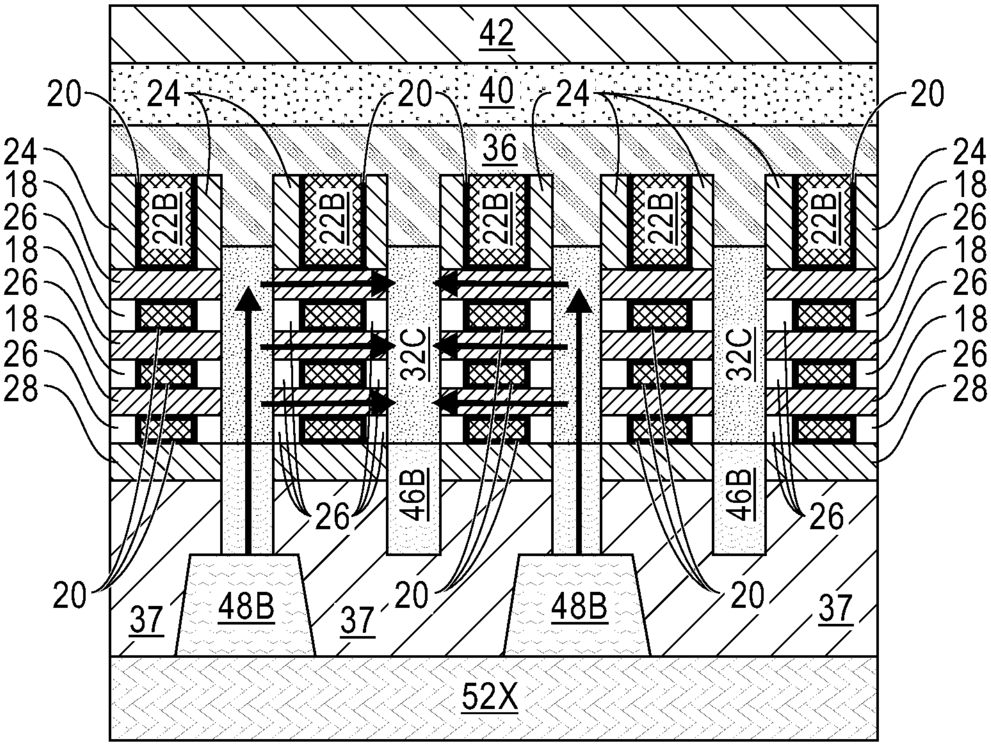
FIGS. 15A, 15B and 15C are cross sectional views of the exemplary structure shown in FIGS. 13A, 13B and 13C, respectively, after forming the first backside metal level including Vss power rails and Vdd power rails in the second region.
Figure 15C:
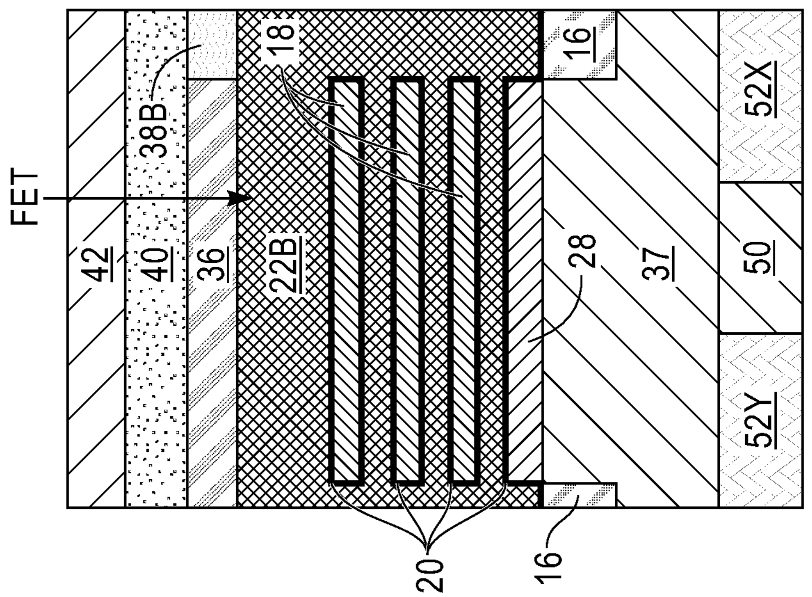
Figure 15B:
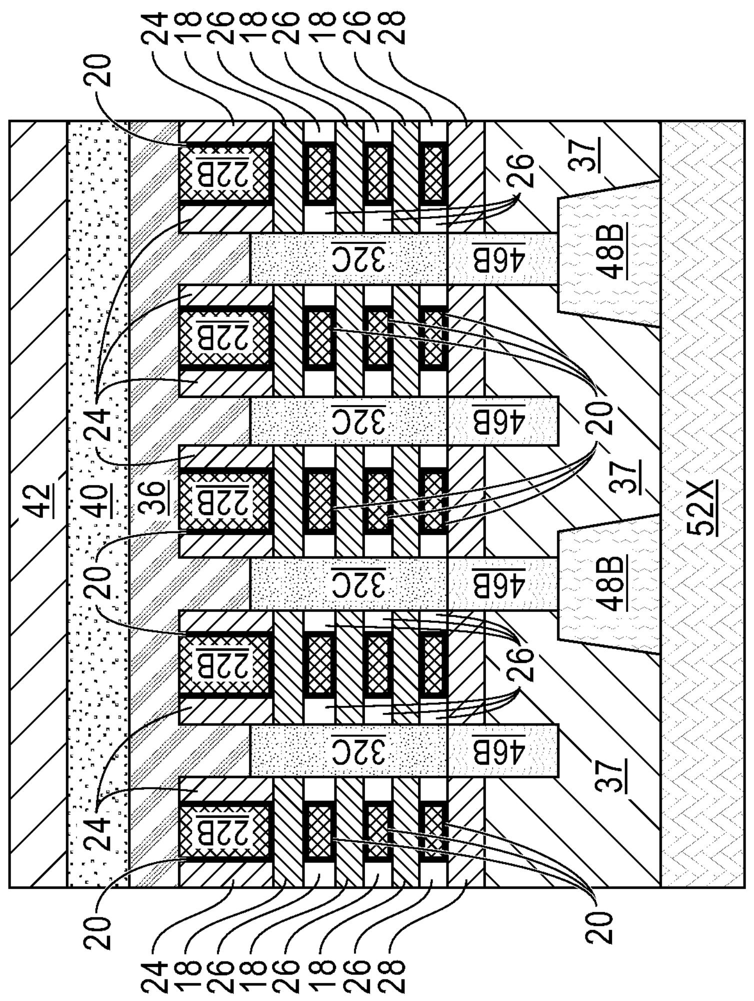

Referring now to FIGS. 14A, 14B and 14C, there are illustrated the exemplary structure shown in FIGS. 12A, 12B and 12C, respectively, after forming a first backside metal level (BSM1) including Vss power rails 52A, and Vdd power rails 52B in the first region. FIGS. 15A, 15B and 15C illustrate the exemplary structure shown in FIGS. 13A, 13B and 13C, respectively, after forming the BSM1 including Vss power rails 52X and Vdd power rails 53Y in the second region. BSM1 including forming a second backside ILD layer 50 and forming Vss power rails and Vdd power rails in the second backside ILD layer 50 by metallization. During the metallization step, a BSM1 via structure 52 is formed in at least the first regions. In the illustrated embodiment, the BSM1 via structure 52 in the first region is direct physical contact with the one backside metal via structures 46A that contacts the via extension portion 23 of the shared gate structure. Collectively, that BSM1 via structure 52 and the backside metal via structure 48A that contacts the via extension portion 23 of the shared gate structure provide a backside extension contact structure. FIGS. 15A and 15B include arrows that show the direction of current flow during an ESD event. Notably, and during an ESD event, the power rail clamping FET is connected in parallel to send excessive current to ground.

The second backside ILD layer 50 is composed of one of the dielectric materials mentioned above for the first backside ILD layer 36. The dielectric material that provides the second backside ILD layer 50 can be compositionally the same, or compositionally different, from the dielectric material that provides the first backside ILD layer 36. The second backside ILD layer 50 can be formed utilizing a deposition process such as, for example, CVD, PECVD, or spring-on coating.

The Vss power rails 52A, 52X, Vdd power rails 52B, 52Y and the BSM1 via structure 52 are composed of any electrically conductive power rail material including, but not limited to, W, Co, Ru, Al, Cu, Pt, Rh, or Pd. During the metallization process, a diffusion barrier liner (not shown) can be formed along the sidewalls of the Vss power rails, Vdd power rails and the BSM1 via structure s52.

Figure 16A:
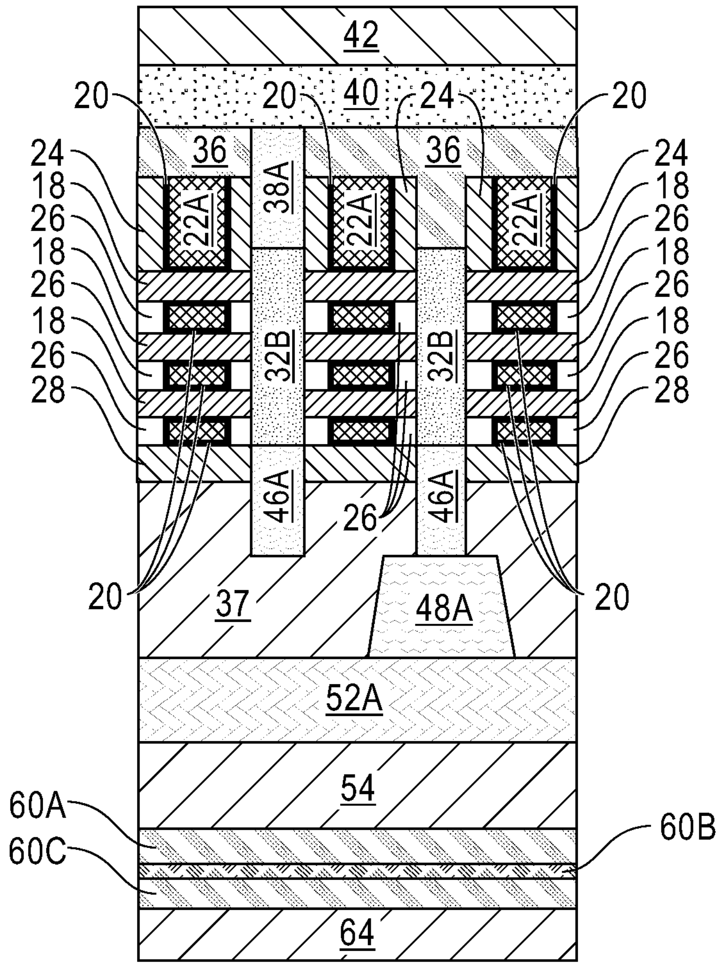
FIGS. 16A, 16B and 16C are cross sectional views of the exemplary structure shown in FIGS. 14A, 14B and 14C, respectively, after forming a second backside metal level, a third backside metal level, and a passive device in the first region.
Figure 16B:
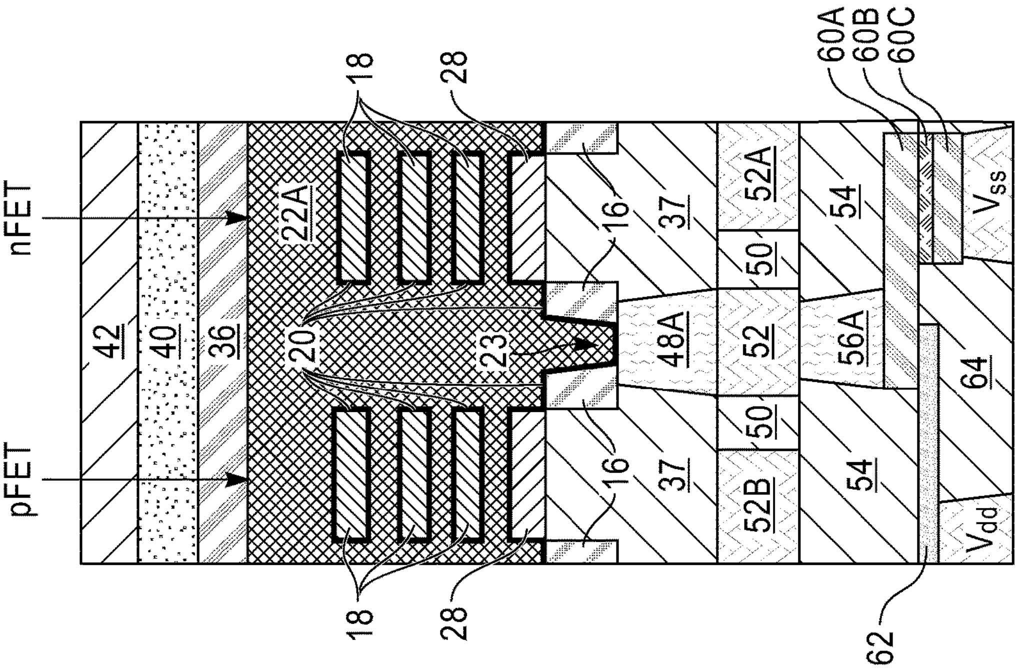
Figure 16C:
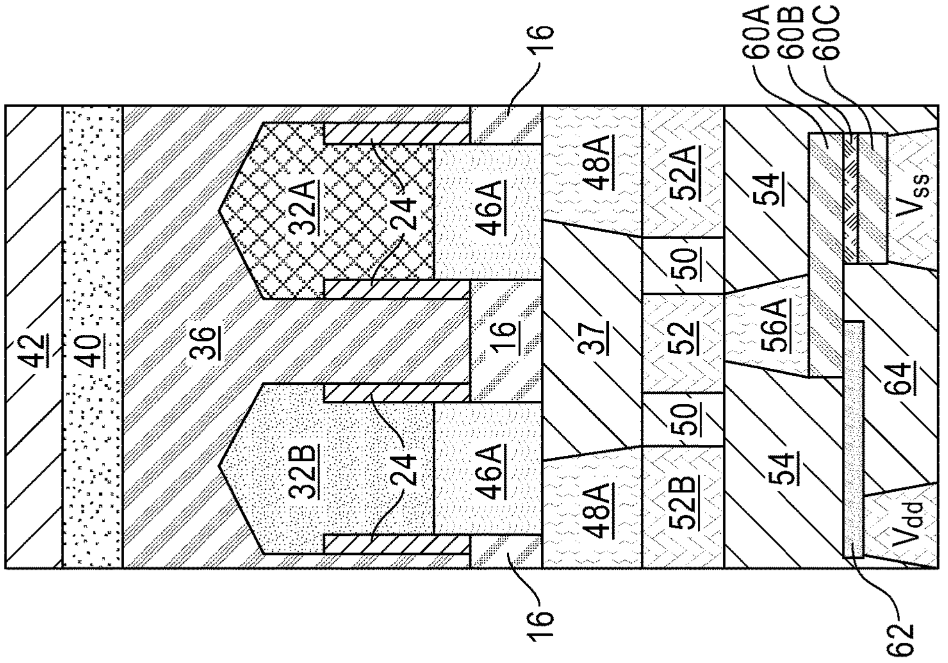
Figure 17A:
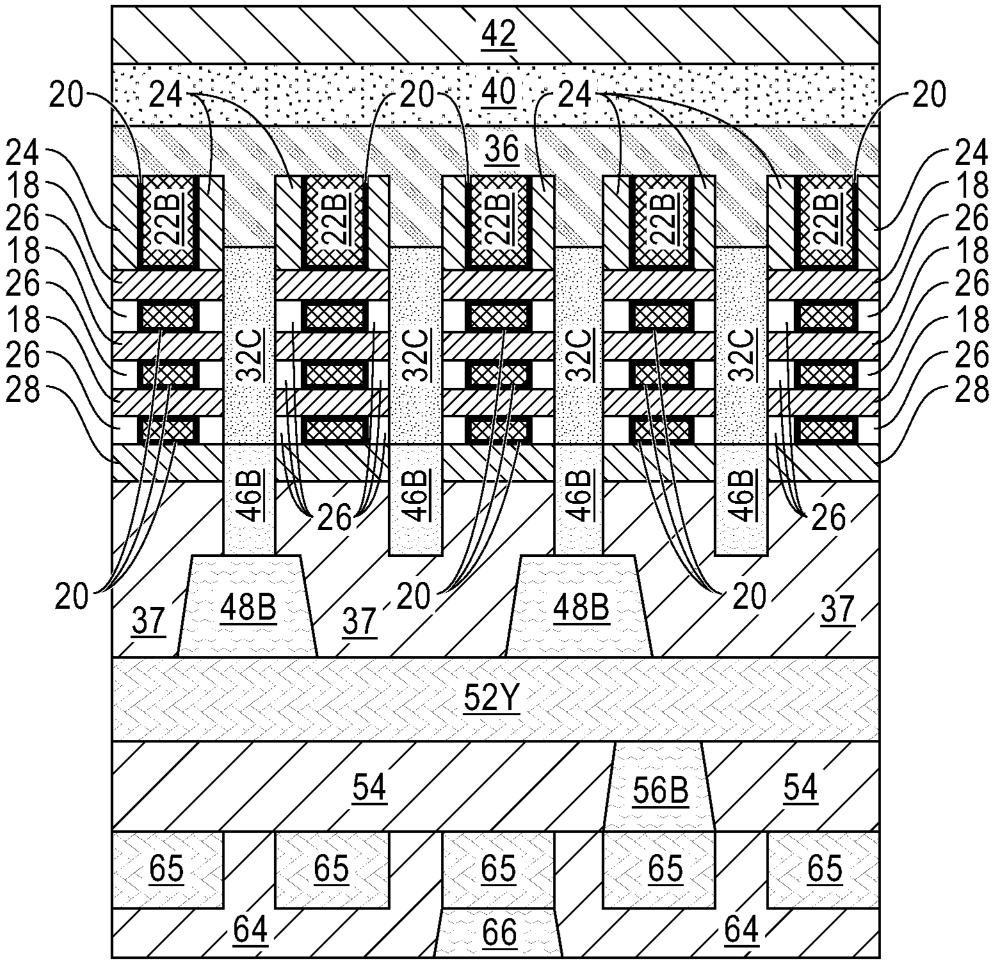
FIGS. 17A, 17B and 17C are cross sectional views of the exemplary structure shown in FIGS. 15A, 15B and 15C, respectively, after forming the second backside metal level and the third backside metal level in second region.
Figure 17C:
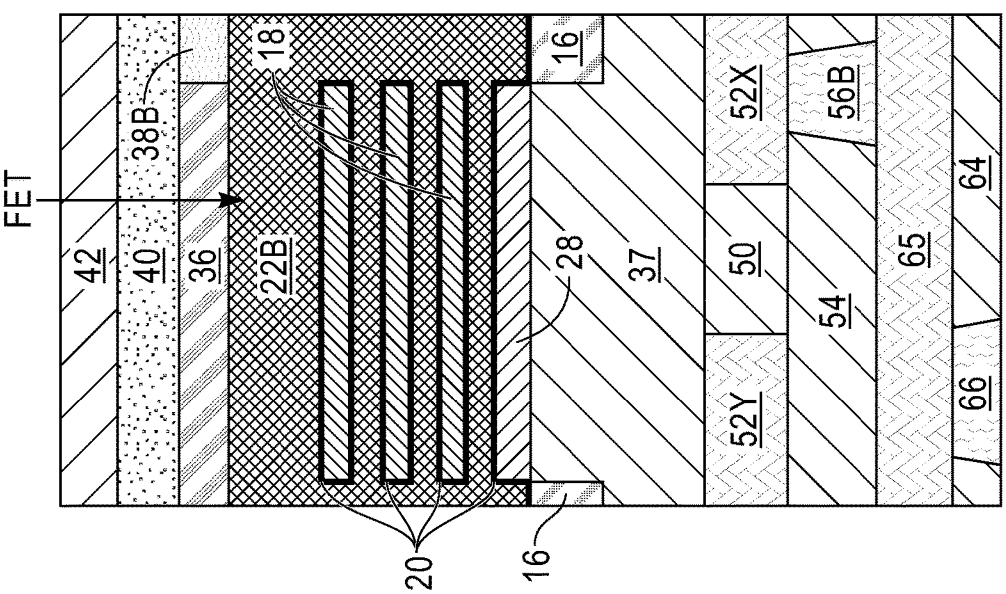
Figure 17B:
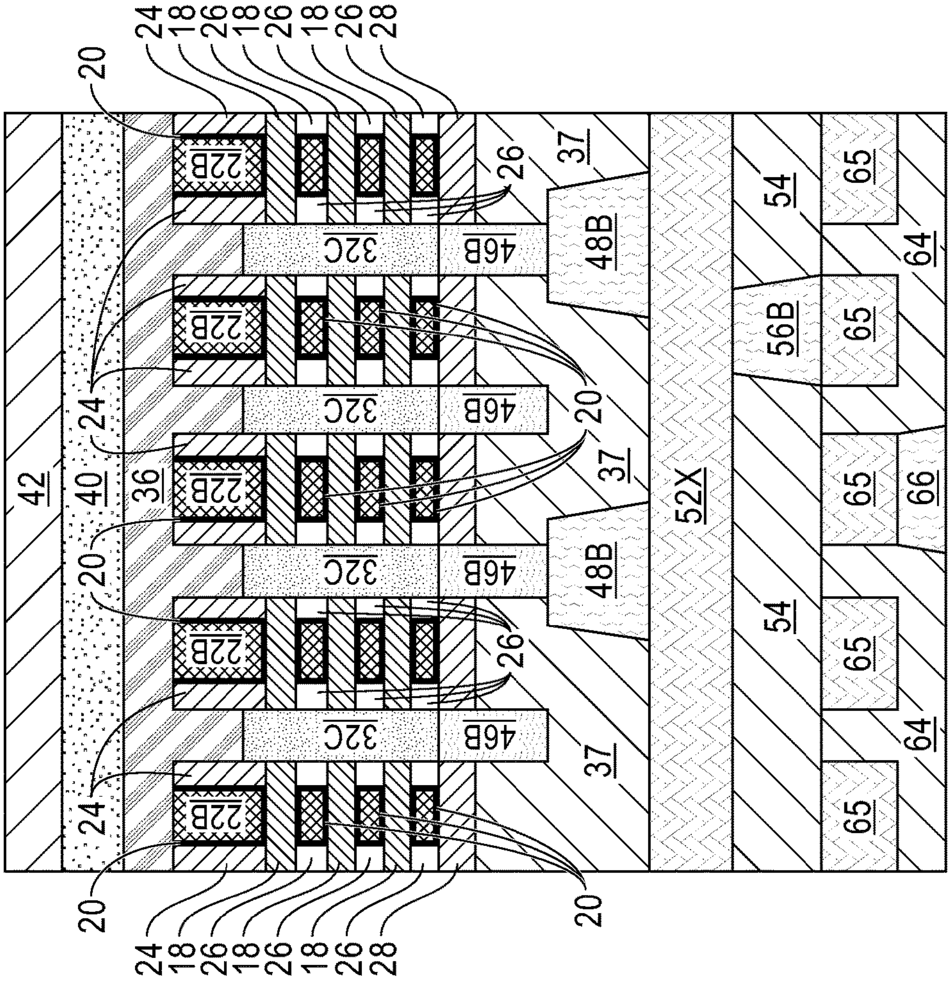

Referring now to FIGS. 16A, 16B and 16C, there are illustrated the exemplary structure shown in FIGS. 14A, 14B and 14C, respectively, after forming a second backside metal level (BSM2), a third backside metal level (BSM3), and a passive device in the first region. FIGS. 17A, 17B and 17C illustrate the exemplary structure shown in FIGS. 15A, 15B and 15C, respectively, after forming the BSM2 and the BSM3 in second region. Note that no passive device is formed in the second region.

BSM2 includes a third backside ILD layer 54 and second metal level contact via structures 56A, 56B. The third backside ILD layer 54 is composed of one of the dielectric materials mentioned above for the first backside ILD layer 36. The dielectric material that provides the third backside ILD layer 54 can be compositionally the same, or compositionally different, from the dielectric material that provides the first backside ILD layer 36 and/or the second backside ILD layer 50. The third backside ILD layer 54 can be formed utilizing a deposition process such as, for example, CVD, PECVD, or spin-on coating.

Second metal level contact via structures 56A, 56B are composed of any electrically conductive material such as, but not limited to, W, Co, Ru, Al, Cu, Pt, Rh, or Pd. The second metal level contact via structures 56A, 56B are formed using another metallization process. During the metallization process, a diffusion barrier liner (not shown) can be formed along the sidewalls of metal level contact via structures 56A, 56B.

Passive device is now formed in the third backside ILD layer 54. The passive device includes a capacitor 60 and a resistor 62. The capacitor 60 is a MIM capacitor including a capacitor dielectric layer 60B sandwiched between a first metal plate 60A and a second metal plate 60C. The first metal plate 60A and the second metal plate 60C are composed of a same or different capacitor electrode material. Exemplary capacitor electrode materials that can be used in providing the first metal plate 60A and the second metal plate 60C include but are not limited to, TiN TaN, or WN. The capacitor dielectric layer 60B is composed of a capacitor dielectric material including, for example, one of the high-k dielectric materials mentioned above for use as the gate dielectric material. The capacitor 60 is formed by forming an opening in the third backside ILD layer 54, and the deposition of the various capacitor material layers within that opening. The capacitor 60 is designed such that a first surface of the first metal plate 60A contacts a first surface of the resistor 62, and the second metal plate 60C contacts a third backside metal level Vss power rail to be subsequently formed. The first metal plate 60A also has a second surface opposite the first surface that contacts a surface of the backside extension contact structure.

The resistor 62 is composed of a resistive material such as, for example, a metal, metal nitride, metal oxide, or polySi. Exemplary metal containing resistive materials include, but are not limited to, WSi or TiN. The can be formed by forming another opening in the third backside ILD layer 54 and then depositing (CVD, PECVD, sputtering or platting) of a layer of the resistive material within the opening. A planarization process can follow the deposition of the layer of resistive material. The resistor 62 is designed to have a first surface that contacts the first metal plate 60A and a second surface, opposite the first surface, that a third backside metal level Vdd power rail to be subsequently formed.

BSM3 includes a fourth backside ILD layer 64 that embeds third backside metal level third backside metal level Vss power rail, Vss, and third backside metal level third backside metal level Vdd power rails, Vdd, third backside metal level third backside metal level conductive structure 65, and third backside metal level via structures 66. As is shown, one of the third backside metal level Vdd power rails, Vdd, contacts a surface of the resistor 62 and one of the third backside metal level Vss power rails, Vss, contacts a surface of the second metal plate 60C of the capacitor 60. It is noted that the third backside metal level conductive structures 65 are Vss and Vdd power rail structures that are formed in the second region.

The fourth backside ILD layer 64 is composed of one of the dielectric materials mentioned above for the first backside ILD layer 36. The fourth backside ILD layer 64 can be formed utilizing a deposition process such as, for example, CVD, PECVD, or spin-on coating.

Third backside metal level Vdd power rails, third backside metal level Vss power rails, the third backside metal level conductive structures 65, and third backside metal level via structures 66 of any electrically conductive material such as, but not limited to, W, Co, Ru, Al, Cu, Pt, Rh, or Pd. The third backside metal level Vdd power rails, Vdd, third backside metal level Vss power rails, Vss, the third backside metal level conductive structures 65 and third backside metal level via structures 66 are formed using another metallization process. During the metallization process, a diffusion barrier liner (not shown) can be formed along the sidewalls of third backside metal level Vdd power rails, Vdd, the third backside metal level Vss power rails, Vss, the third backside metal level conductive structures 65, and third backside metal level via structures 66.

Figure 18A:
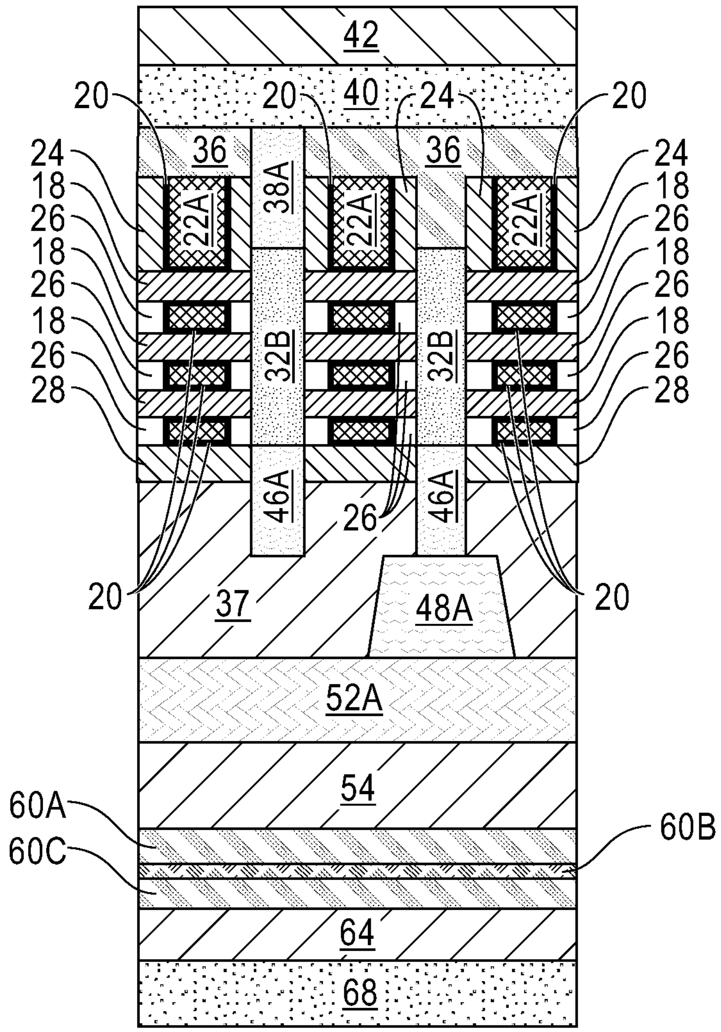
FIGS. 18A, 18B and 18C are cross sectional views of the exemplary structure shown in FIGS. 16A, 16B and 16C, respectively, after forming a BSPDN in the first region.
Figure 18B:
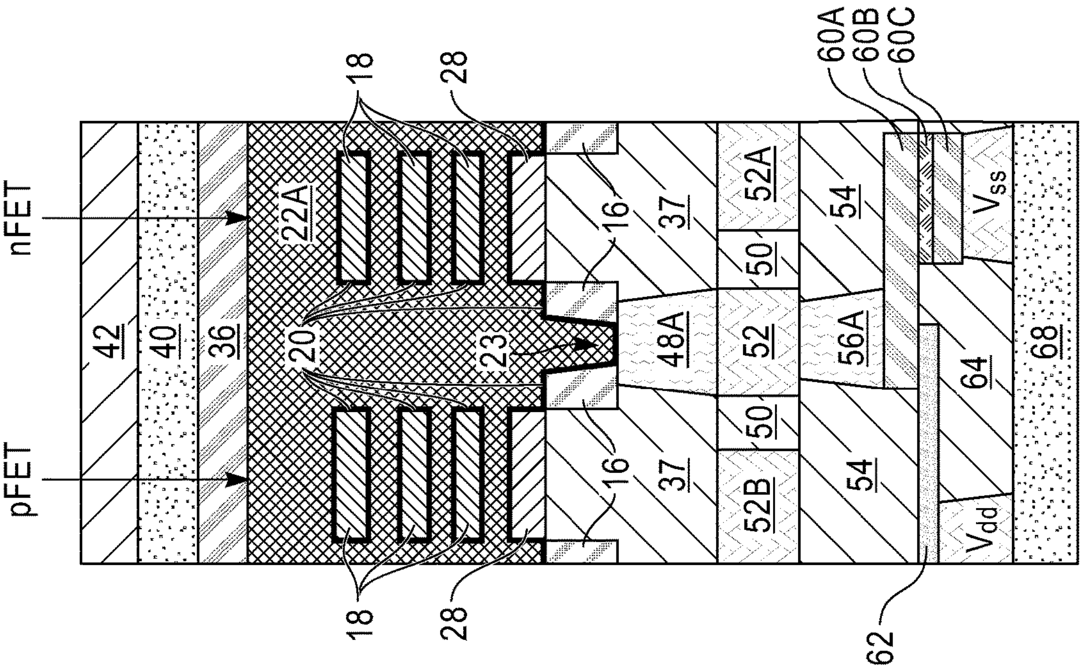
Figure 18C:
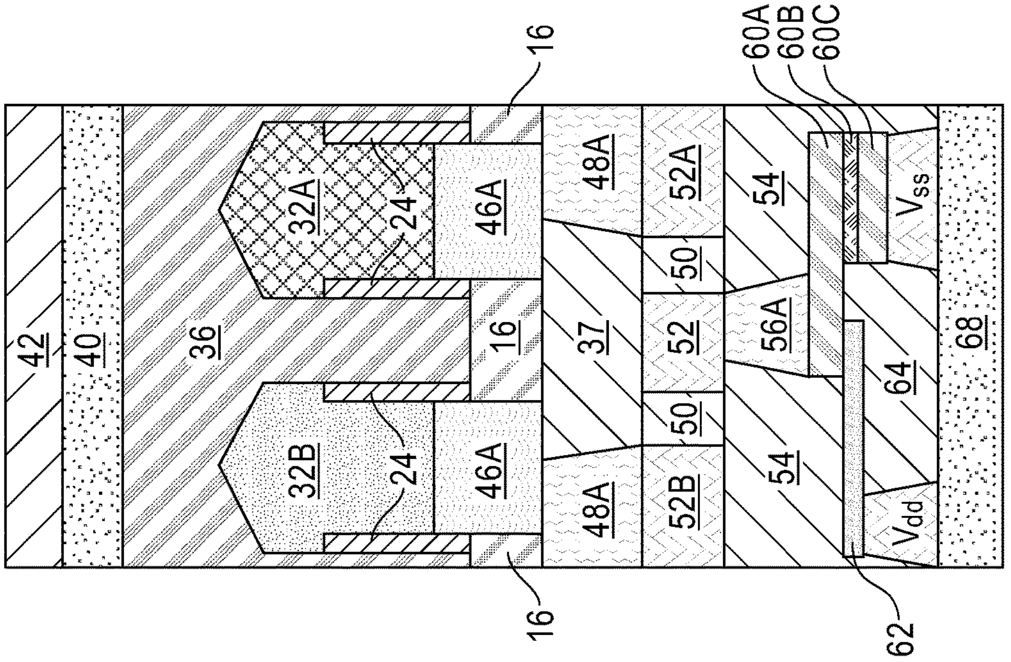
Figure 19A:
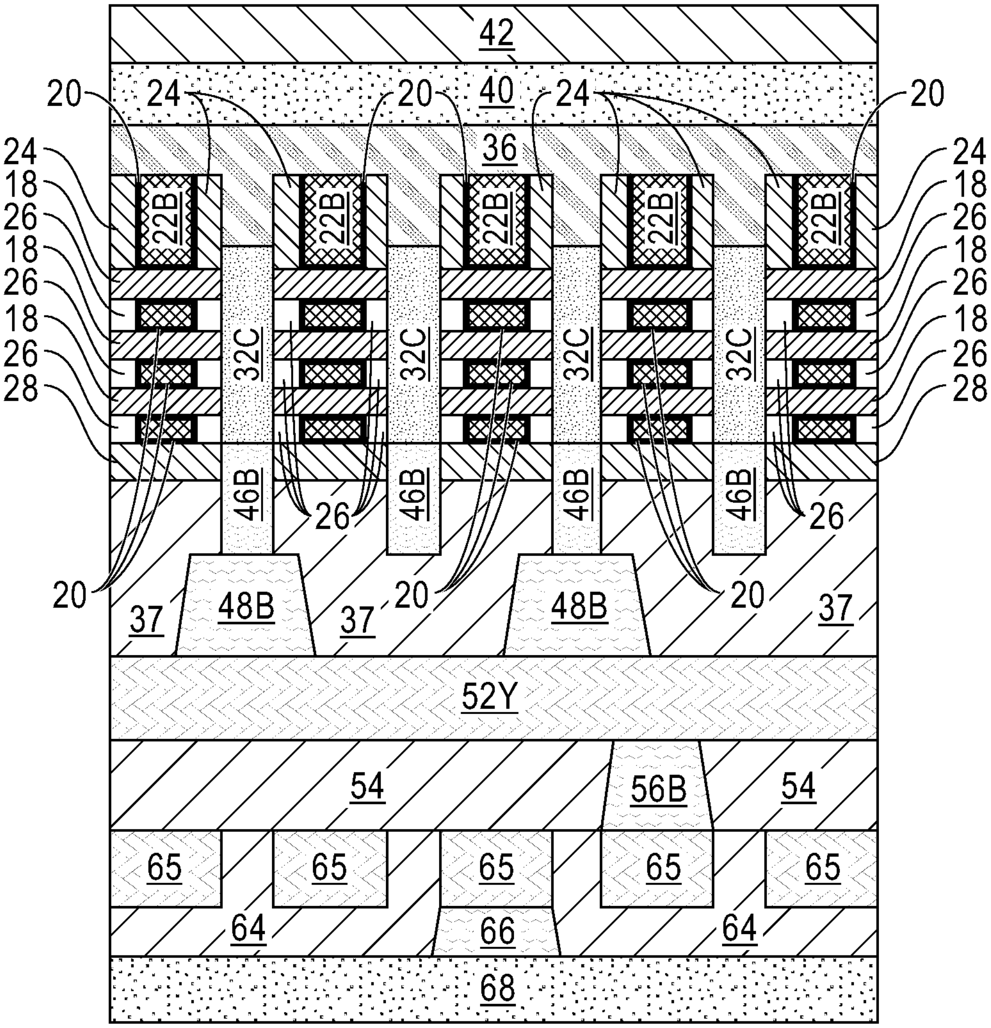
FIGS. 19A, 19B and 19C are cross sectional views of the exemplary structure shown in FIGS. 17A, 17B and 17C, respectively, after forming the BSPDN in the second region.
Figure 19C:
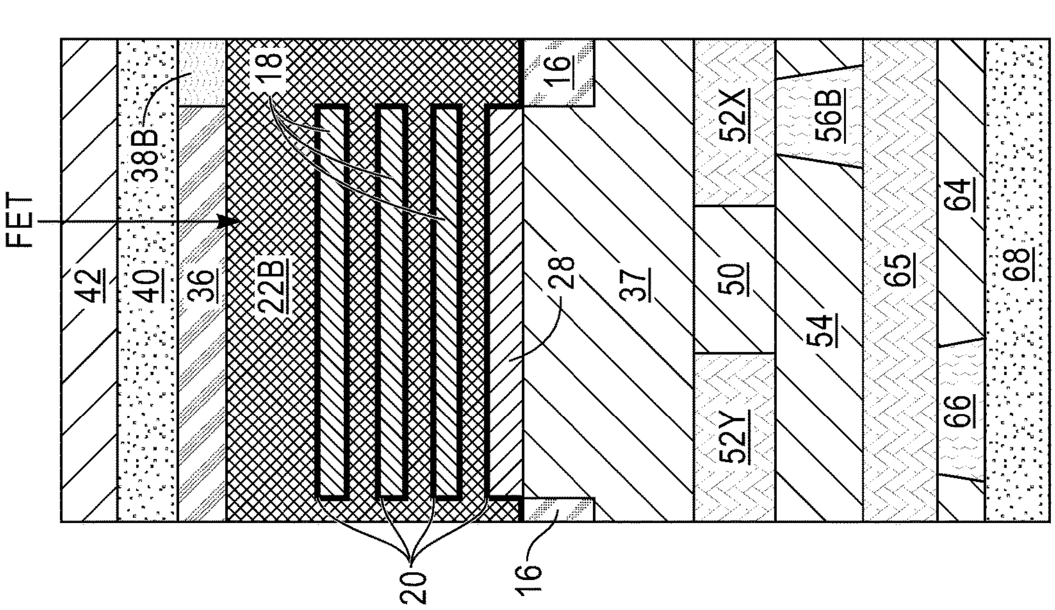
Figure 19B:
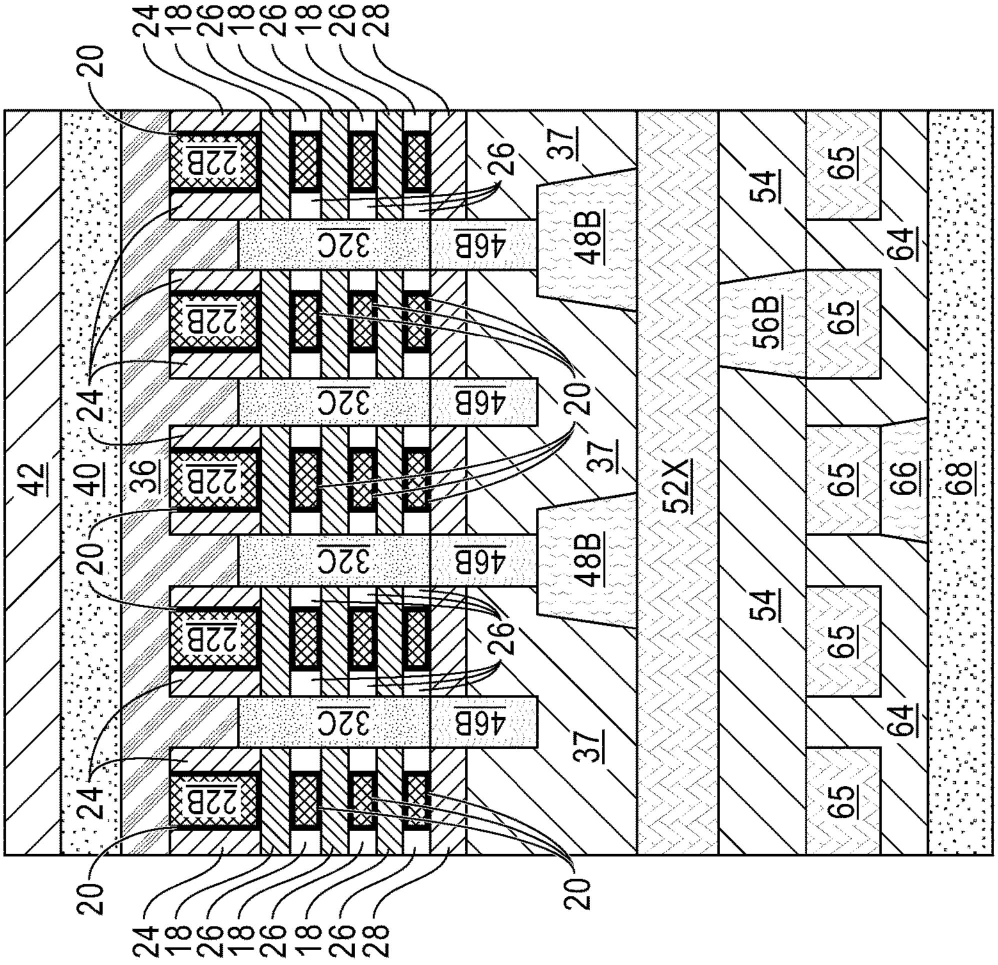

Referring now to FIGS. 18A, 18B and 18C, there are illustrated the exemplary structure shown in FIGS. 16A, 16B and 16C, respectively, after forming a backside power distribution network (BSPDN) 68 in the first region. FIGS. 19A, 19B and 19C illustrate the exemplary structure shown in FIGS. 17A, 17B and 17C, respectively, after forming the BSPDN 68 in the second region. The BSPDN 68 includes elements/components that configured to distribute power to the transistors. The BSPDN 68 contact each of the third backside metal level Vdd power rails, third backside metal level Vss power rails, and third backside metal level via structures 66.

Figure 20:
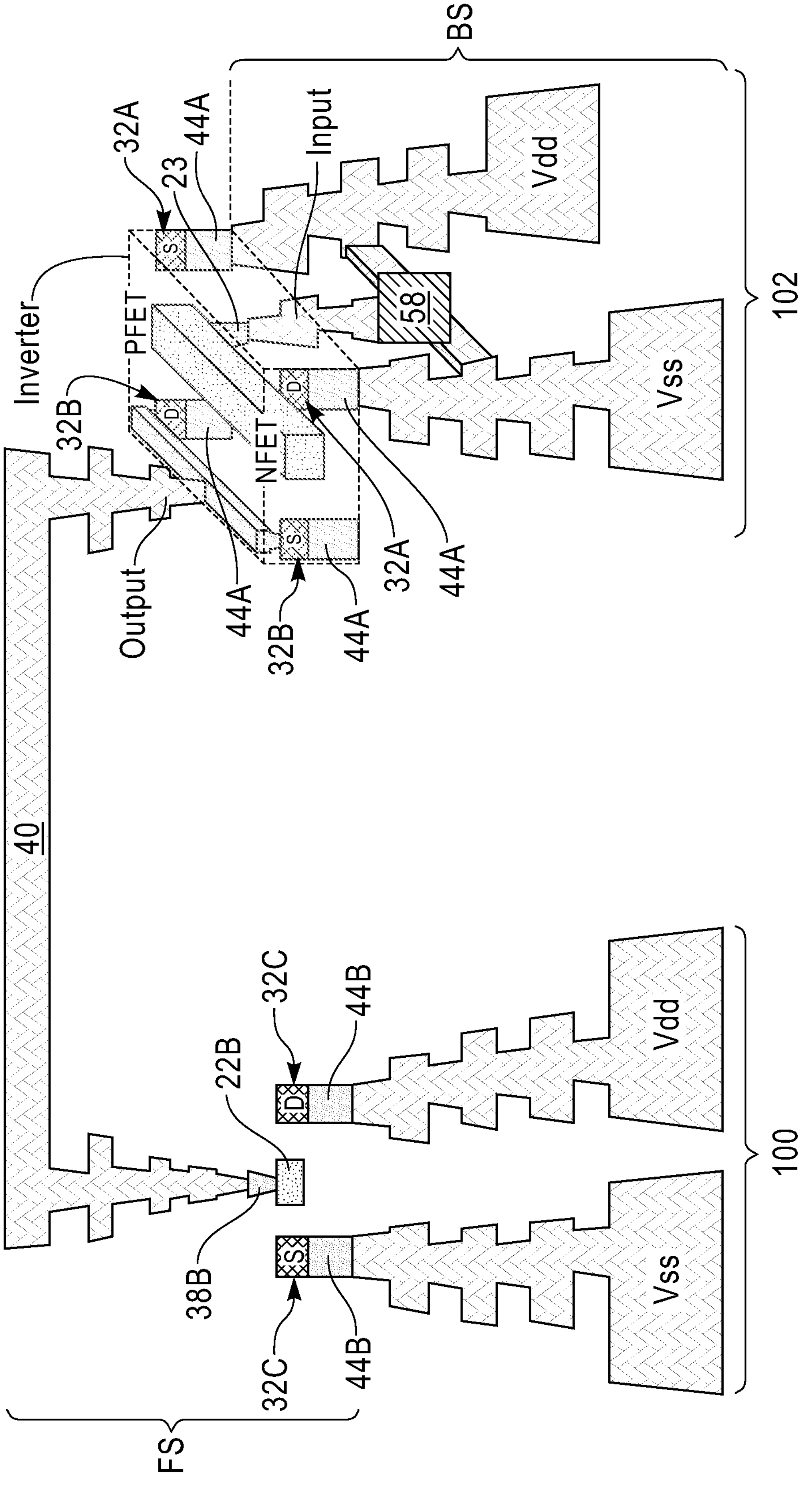
FIG. 20 is a high level circuit diagram of the semiconductor structure of the present application.

FIG. 20 illustrates a high level circuit diagram of the semiconductor structure shown in FIGS. 18A-18C and FIGS. 19A-19C. In FIG. 20, the first region is labeled as 102, and the second region is labeled as 100. In FIG. 20, FS denotes the frontside of the wafer, BS denotes the backside of the wafer, “S” denotes a source region, and “D” denotes a drain region. Collectively, FIGS. 18A-18C, FIGS. 19A-19C and FIG. 20 illustrate the structure of the present application. The structure includes an inverter including pFET and nFET having a shared gate structure (gate electrode 22 of the shared gate structure). The structure further includes passive device labeled as 58 in FIG. 20 (including capacitor 60 and resistor 62 not shown in FIG. 20) electrically connected to the shared gate structure of the inverter by backside extension contact structure 48A/52 shown in FIG. 18B (labeled as Input in DIF. 20). Backside extension contact structure 48A/52 is configured to send excess current to ground during an electrostatic discharge event.

The structure further includes BSPDN 68 electrically connected to the passive device. Notably, first metal plate 60A of the capacitor 60 contacts a first surface of the resistor 62, and the second metal plate 60C of the capacitor MIM capacitor contacts third backside metal level Vss power rail. The third backside metal level Vss power rail contacts the BSPDN 68. A second surface of the resistor 62 contacts third backside metal level Vdd power rail, and the third backside metal level Vdd power rail contacts the BSPDN 68. As is also illustrated, the backside extension contact structure has a first surface contacting a via extension portion 23 of the shared gate structure and a second surface opposite the first that contacts the first metal plate 60A of the capacitor 60. Via extension portion 23 of the shared gate structure is laterally surrounded by shallow trench isolation structure 16.

The pFET of the inverter has a first source/drain region (one of source/drain region 32B) electrically connected to a first backside metal level Vdd power rail 52A by one backside source/contact structure 48A, and the nFET has a first source/drain region (one of source/drain region 32A) electrically connected to first backside metal level Vss power rail 52B by another backside source/drain contact structure 48A. The pFET has a second source/drain region (another of source/drain region 32B) and the nFET has second source/drain region (another of source/drain region 23A), wherein second source/drain region of the pFET and the second source/drain region of the nFET are electrically connected by frontside contact structure 38A. The frontside contact structure 38A contacts BEOL structure 40. Carrier wafer 42 can be located on and contacting the BEOL structure 40.

The structure further includes a power rail clamping FET located adjacent to the inverter and having a larger gate length than the pFET and nFET of the inverter, and wherein a gate electrode 22B of the power rail clamping FET is electrically connected to the BEOL structure 40 by the frontside gate contact structure 38B. The power rail clamping FET has a first source/drain region electrically connected to the first backside metal level Vdd power rail 52Y by one backside source/drain contact structure 48B and a second source/drain region electrically connected to the first backside metal level Vss power rail 52X by another backside source/drain contact structure 48B. The power rail clamping FET is connected in parallel between the first backside metal level Vdd power rail and the first backside metal level Vss power rail, and configured to provide a current path during an electrostatic discharge event.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

an inverter comprising a p-type field transistor (pFET) and an n-type field effect transistor (nFET) having a shared gate structure comprising a gate electrode and a gate dielectric that are common to both the pFET and the nFET and are present between the nFET and the pFET, the shared gate electrode having a via extending portion that extends through a shallow trench isolation structure located between the pFET and the nFET of the inverter;

a passive device electrically connected to the via extending portion of the shared gate structure of the inverter by a backside extension contact structure; and a backside power distribution network electrically connected to the passive device.

2. The semiconductor structure of claim 1, wherein the passive device comprises a capacitor and a resistor.

3. The semiconductor structure of claim 2, wherein the resistor is composed of a metal, metal nitride, metal oxide or polySi.

4. The semiconductor structure of claim 2, wherein the capacitor is a metal-insulator-metal (MIM) capacitor comprising a capacitor dielectric layer sandwiched between a first metal plate and a second metal plate.

5. The semiconductor structure of claim 4, wherein the first metal plate of the MIM capacitor contacts a first surface of the resistor, and the second metal plate of the MIM capacitor contacts a third backside metal level Vss power rail.

6. The semiconductor structure of claim 5, wherein the third backside metal level Vss power rail contacts the backside power distribution network.

7. The semiconductor structure of claim 5, wherein a second surface of the resistor contacts a third backside metal level Vdd power rail, and the third backside metal level Vdd power rail contacts the backside power distribution network.

8. The semiconductor structure of claim 4, wherein the backside extension contact structure has a first surface contacting the via extension portion of the shared gate structure and a second surface opposite the first that contacts the first metal plate of the MIM capacitor.

9. The semiconductor structure of claim 8, wherein the via extension portion of the shared gate structure is laterally surrounded by the shallow trench isolation structure.

10. The semiconductor structure of claim 1, wherein the pFET has a first source/drain region electrically connected to a first backside metal level Vdd power rail by a first backside source/contact structure, and the nFET has a first source/drain region electrically connected to a first backside metal level Vss power rail by a second backside source/drain contact structure.

11. The semiconductor structure of claim 10, wherein the pFET has a second source/drain region and the nFET has a second source/drain region, wherein the second source/drain region of the pFET and the second source/drain region of the nFET are electrically connected by a frontside contact structure.

12. The semiconductor structure of claim 11, wherein the frontside contact structure contacts a frontside back-of-the-line (BEOL) structure.

13. The semiconductor structure of claim 12, further comprising a carrier wafer contacting the BEOL structure.

14. The semiconductor structure of claim 12, further comprising a power rail clamping field effect transistor (FET) located adjacent to the inverter and having a larger gate length than the pFET and nFET of the inverter, and wherein a gate electrode of the power rail clamping FET is electrically connected to the BEOL structure by a frontside gate contact structure.

15. The semiconductor structure of claim 14, wherein the power rail clamping FET has a first source/drain region electrically connected to a first backside metal level Vdd power rail by a first backside source/drain contact structure and a second source/drain region electrically connected to a first backside metal level Vss power rail by a second backside source/drain contact structure.

16. The semiconductor structure of claim 15, wherein the power rail clamping FET is connected in parallel between the first backside metal level Vdd power rail and the first backside metal level Vss power rail, and configured to provide a current path during an electrostatic discharge event.

17. The semiconductor structure of claim 14, wherein the power rail clamping FET, the pFET and the nFET are all nanosheet containing FETs.

18. The semiconductor structure of claim 17, further comprising a bottom dielectric isolation layer located beneath each of the nanosheet containing FETs.

19. The semiconductor structure of claim 1, wherein the passive device is embedded by backside interlayer dielectric layers.

20. The semiconductor structure of claim 1, wherein the backside extension contact structure is configured to send excess current to ground during an electrostatic discharge event.

* * * * *